US012795901B2

(12) United States Patent
Liu et al.

(10) Patent No.: US 12,795,901 B2
(45) Date of Patent: Nov. 10, 2026

(54) MEMORY DEVICES AND METHODS FOR FORMING THE SAME

(71) Applicant: YANGTZE MEMORY TECHNOLOGIES CO., LTD., Wuhan (CN)

(72) Inventors: Yaqin Liu, Wuhan (CN); Yanhong Wang, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 481 days.

(21) Appl. No.: 18/219,570

(22) Filed: Jul. 7, 2023

(65) Prior Publication Data

US 2024/0023320 A1 Jan. 18, 2024

Related U.S. Application Data

(60) Provisional application No. 63/388,855, filed on Jul. 13, 2022.

(30) Foreign Application Priority Data

Jun. 27, 2023 (CN) ......................... 202310774836.6

(51) Int. Cl.
*H10B 12/00* (2023.01)
*H10B 63/00* (2023.01)
*H10B 63/10* (2023.01)

(52) U.S. Cl.
CPC ........... *H10B 12/485* (2023.02); *H10B 12/03* (2023.02); *H10B 12/05* (2023.02); *H10B 12/50* (2023.02); *H10B 63/10* (2023.02); *H10B 63/34* (2023.02); *H10B 63/84* (2023.02)

(58) Field of Classification Search
CPC ...... H10B 12/485; H10B 12/03; H10B 12/05; H10B 12/50; H10B 63/10; H10B 63/34; H10B 63/84; H10B 63/80; H10B 12/09; H10B 12/31
See application file for complete search history.

(56) References Cited

U.S. PATENT DOCUMENTS

2005/0280061 A1* 12/2005 Lee ...................... H10B 12/315 257/296
2022/0102334 A1* 3/2022 Kim ....................... H10B 41/35

* cited by examiner

*Primary Examiner* — Samuel Park
(74) *Attorney, Agent, or Firm* — BAYES PLLC

(57) ABSTRACT

A memory device includes a memory array structure including a vertical transistor having a first terminal and a second terminal, a storage unit having a first end coupled to the first terminal of the vertical transistor, and a bit line coupled to the second terminal of the vertical transistor, a first peripheral circuit coupled to a first surface of the memory array structure, and a second peripheral circuit coupled to a second surface of the memory array structure opposite to the first surface. The vertical transistor includes a semiconductor body extending in a first direction, and a gate structure coupled to at least one side of the semiconductor body.

20 Claims, 39 Drawing Sheets

1000

200

504

504

532

2200

900

800

3900

MEMORY DEVICES AND METHODS FOR FORMING THE SAME

CROSS-REFERENCE TO RELATED APPLICATIONS

This application claims the benefit of priorities to C.N. Application No. 202310774836.6, filed on Jun. 27, 2023, and U.S. Provisional Application No. 63/388,855, filed on Jul. 13, 2022, both of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device is disclosed. The memory device includes a memory array structure including a vertical transistor having a first terminal and a second terminal, a storage unit having a first end coupled to the first terminal of the vertical transistor, and a bit line coupled to the second terminal of the vertical transistor, a first peripheral circuit coupled to a first surface of the memory array structure, and a second peripheral circuit coupled to a second surface of the memory array structure opposite to the first surface. The vertical transistor includes a semiconductor body extending in a first direction, and a gate structure coupled to at least one side of the semiconductor body.

In some implementations, the vertical transistor is disposed between the bit line and the storage unit along the first direction.

In some implementations, the memory device further includes a first contact structure extending through the memory array structure and in contact with the first peripheral circuit and the second peripheral circuit.

In some implementations, the memory device further includes a first bonding interface disposed between the memory array structure and the first peripheral circuit, and a second bonding interface disposed between the memory array structure and the second peripheral circuit.

In some implementations, the second peripheral circuit includes a first surface in contact with the memory array structure through the second bonding interface, and a second surface comprising a pad structure.

In some implementations, the first bonding interface is disposed between the first peripheral circuit and the storage unit, and the bit line is disposed between the second bonding interface and the vertical transistor.

In some implementations, the bit line is in contact with the first peripheral circuit through a second contact structure, and the gate structure is in contact with the first peripheral circuit through a third contact structure.

In some implementations, the second contact structure extends in the first direction longer than the vertical transistor, and the third contact structure extends in the first direction longer than the storage unit.

In some implementations, the vertical transistor is disposed between the storage unit and the first peripheral circuit along the first direction.

In some implementations, the storage unit is disposed between the vertical transistor and the first peripheral circuit along the first direction.

In some implementations, the memory array structure is bonded with the first peripheral circuit.

In some implementations, the first contact structure is longer than the second contact structure in the first direction, and the second contact structure is longer than the third contact structure in the first direction.

In some implementations, the second peripheral circuit further includes a first redistribution layer in contact with the second bonding interface.

In some implementations, a substrate of the second peripheral circuit is in contact with the second bonding interface.

In some implementations, the first bonding interface is disposed between the first peripheral circuit and the bit line, and the second bonding interface is disposed between the second peripheral circuit and the storage unit.

In some implementations, a second end of the storage unit is in contact with the first peripheral circuit through a second contact structure, and the second contact structure extends in the first direction longer than the vertical transistor.

In some implementations, the second contact structure extends in the first direction longer than the storage unit.

In some implementations, the second peripheral circuit further includes a first redistribution layer in contact with the second bonding interface.

In some implementations, the first peripheral circuit includes a sense amplifier circuit and a word line driver circuit. In some implementations, the second peripheral circuit comprises an analog circuit.

In another aspect, a memory system is disclosed. The memory system includes a memory device configured to store data, and a memory controller coupled to the memory device and configured to control the memory array structure through the first peripheral circuit. The memory device includes a memory array structure including a vertical transistor having a first terminal and a second terminal, a storage unit having a first end coupled to the first terminal of the vertical transistor, and a bit line coupled to the second terminal of the vertical transistor, a first peripheral circuit coupled to a first surface of the memory array structure, and a second peripheral circuit coupled to a second surface of the memory array structure opposite to the first surface. The vertical transistor includes a semiconductor body extending in a first direction, and a gate structure coupled to at least one side of the semiconductor body.

In still another aspect, a method for forming a memory device is disclosed. A memory array structure is formed. The memory array structure includes a vertical transistor having a first terminal and a second terminal, a storage unit having a first end coupled to the first terminal of the vertical transistor, and a bit line coupled to the second terminal of the vertical transistor. At least one contact structure is formed in contact with the bit line. A first peripheral circuit is bonded with the memory array structure. A second peripheral circuit is bonded with the memory array structure.

In some implementations, the vertical transistor is formed on a first substrate having the second terminal of the vertical transistor in contact with the first substrate, and the storage unit is formed on the vertical transistor having the first end of the storage unit coupled to the first terminal of the vertical transistor.

In some implementations, a second substrate is formed on the storage unit, the first substrate is removed to expose the second terminal of the vertical transistor, the bit line is formed on the second terminal of the vertical transistor, a third substrate is formed on the bit line, and the second substrate is removed.

In some implementations, a first contact structure is formed in contact with the bit line, a second contact structure is formed in contact with a second end of the storage unit, and a third contact structure is formed in contact with a gate structure of the vertical transistor.

In some implementations, a first bonding interface is formed on the first peripheral circuit, and the first peripheral circuit is bonded with the memory array structure having the first contact structure, the second contact structure, and the third contact structure in contact with the first bonding interface.

In some implementations, a fourth contact structure is formed extending through the memory array structure and in contact with the first peripheral circuit and the second peripheral circuit.

In yet another aspect, a method for forming a memory device is disclosed. A memory array structure is formed on a first substrate. The memory array structure includes a vertical transistor having a first terminal and a second terminal, and a storage unit having a first end coupled to the first terminal of the vertical transistor. A first peripheral circuit is formed on a second substrate. The memory array structure is bonded with the first peripheral circuit. A second end of the storage unit faces the first peripheral circuit. The first substrate is removed. A bit line is formed in contact with the second terminal of the vertical transistor. A second peripheral circuit is bonded with the memory array structure.

In some implementations, the vertical transistor is formed on the first substrate having the second terminal of the vertical transistor in contact with the first substrate, and the storage unit is formed on the vertical transistor having the first end of the storage unit coupled to the first terminal of the vertical transistor.

In some implementations, an activation operation is performed to form the second terminal of the vertical transistor, and the bit line is formed on the second terminal of the vertical transistor.

In some implementations, a first contact structure is formed in contact with the bit line, a second contact structure is formed in contact with a second end of the storage unit, and a third contact structure is formed in contact with a gate structure of the vertical transistor.

In some implementations, a fourth contact structure is formed extending through the memory array structure and in contact with the first peripheral circuit.

In some implementations, a bonding interface is formed on the second peripheral circuit, and the second peripheral circuit is bonded with the memory array structure having the first contact structure, the second contact structure, and the third contact structure in contact with the bonding interface.

In yet another aspect, a method for forming a memory device is disclosed. A memory array structure is formed on a first side of a first substrate. The memory array structure includes a vertical transistor having a first terminal and a second terminal, a storage unit having a first end coupled to the first terminal of the vertical transistor, and a bit line coupled to the second terminal of the vertical transistor. At least one contact structure is formed in contact with the bit line. A first peripheral circuit is bonded with the memory array structure. A second peripheral circuit is formed on a second side of the first substrate opposite to the first side.

In some implementations, the vertical transistor is formed on a second substrate having the second terminal of the vertical transistor in contact with the second substrate. The storage unit is formed on the vertical transistor having the first end of the storage unit coupled to the first terminal of the vertical transistor. The first substrate is formed on the storage unit. The second substrate is removed.

In some implementations, an activation operation is performed to form the first terminal of the vertical transistor.

In some implementations, an activation operation is performed to form the second terminal of the vertical transistor, and the bit line is formed on the second terminal of the vertical transistor.

In some implementations, a first contact structure is formed in contact with the bit line, and a second contact structure is formed in contact with a second end of the storage unit.

In some implementations, a first bonding interface is formed on the first peripheral circuit, and the first peripheral circuit is bonded with the memory array structure having the first contact structure and the second contact structure in contact with the first bonding interface.

In some implementations, the first substrate is thinned from the second side of the first substrate, and the second peripheral circuit is formed on the first substrate.

In some implementations, a third substrate is formed on the storage unit, the second substrate is removed to expose the second terminal of the vertical transistor, the bit line is formed on the second terminal of the vertical transistor, the first substrate is formed on the bit line, and the second substrate is removed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
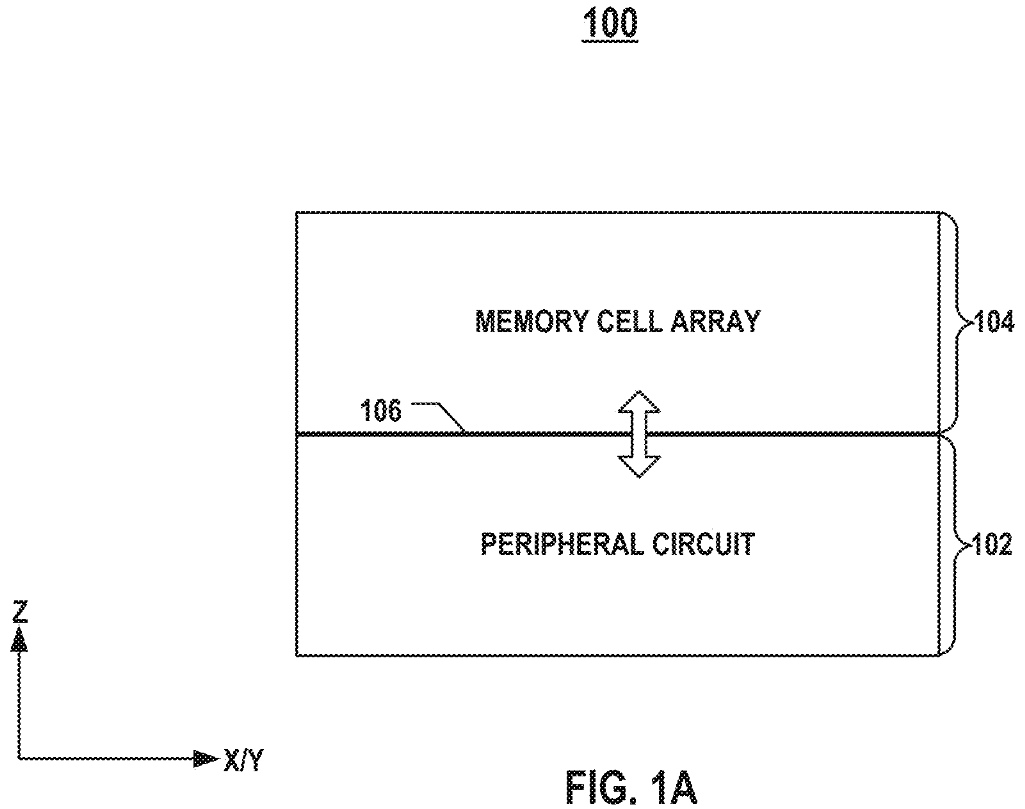
FIG. 1A illustrates a schematic view of a cross-section of a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the planar transistors as the switch and selecting devices in a memory cell array of memory devices (e.g., DRAM, PCM, and FRAM). Compared with planar transistors, the vertically arranged transistors (e.g., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers and bonded together in a face-to-face manner. Thus, the thermal budget for fabricating the memory cell array does not affect the fabrication of the peripheral circuits. The stacked memory cell array and peripheral circuits can also reduce the chip size compared with the side-by-side arrangement, thereby improving the array efficiency. In some implementations, more than one memory cell array is stacked over one another using bonding techniques to further increase the array efficiency. In some implementations, the word lines and bit lines are disposed close to the bonding interface due to the vertically arranged transistors, which can be coupled to the peripheral circuits through a large number (e.g., millions) of parallel bonding contacts across the bonding interface can make direct, short-distance (e.g., micron-level) electrical connections between the memory cell array and peripheral circuits to increase the throughput and input/output (I/O) speed of the memory devices.

In some implementations, the vertical transistors disclosed herein include multi-gate transistors (e.g., gate-all-around (GAA) transistors, tri-gate transistors, or double-gate transistors), which can have a larger gate control area to achieve better channel control with a smaller subthreshold swing. Since the channel is fully depleted, the leakage current of multi-gate transistors can be significantly reduced as well. Thus, using multi-gate transistors instead of planar transistors can achieve a much better speed (saturated drain current)/leakage current performance.

In some implementations, the vertical transistors disclosed herein include single-gate transistors (a.k.a. single-side gate transistors) in a mirror-symmetric arrangement with respect to adjacent transistors in the bit line direction as a result of splitting multi-gate transistors (e.g., double-gate transistors) using trench isolations extending along the word line direction. Thus, the memory cell density in the bit line direction can be significantly increased (e.g., doubled) without unduly complicating the fabrication process compared with using processes, such as self-aligned double patterning (SADP). Also, the mirror-symmetric single-gate transistors have a larger process window for word line, bit line, and transistor pitch reduction, compared to either planar transistors or multi-gate vertical transistors, for example, with dual-side or all-around gates.

FIG. 1A illustrates a schematic view of a cross-section of a memory device 100, according to some aspects of the present disclosure. Memory device 100 represents an example of a bonded chip. The components of memory device 100 (e.g., memory cell array and peripheral circuits) can be formed separately on different substrates and then jointed to form a bonded chip. Memory device 100 can include a first semiconductor structure 102 including the peripheral circuits of a memory cell array. Memory device 100 can also include a second semiconductor structure 104 including the memory cell array. The peripheral circuits (e.g., control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, memory device 100 can also include second semiconductor structure 104 including an array of memory cells (memory cell array) that can use transistors as the switch and selecting devices. In some implementations, the memory cell array includes an array of DRAM cells. For ease of description, a DRAM cell array may be used as an example for describing the memory cell array in the present disclosure. But it is understood that the memory cell array is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some implementations, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementations.

As shown in FIG. 1A, memory device 100 further includes a bonding interface 106 vertically between (in the vertical direction, e.g., the Z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
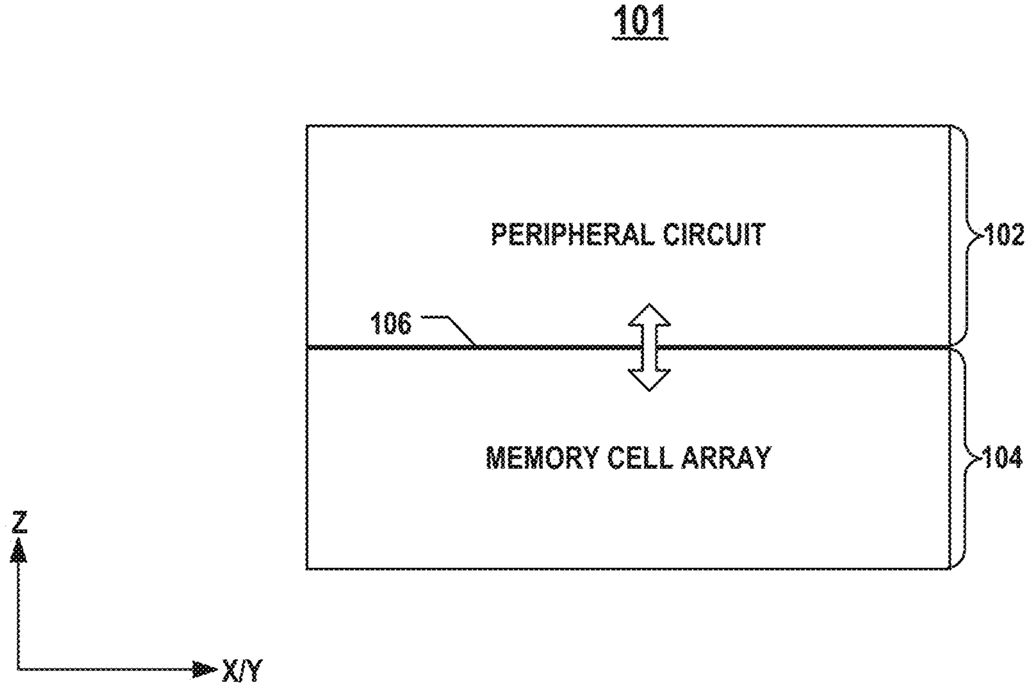
FIG. 1B illustrates a schematic view of a cross-section of another memory device, according to some aspects of the present disclosure.

It is understood that the relative positions of stacked first and second semiconductor structures 102 and 104 are not limited. FIG. 1B illustrates a schematic view of a cross-section of another exemplary memory device 101, according to some implementations. Different from memory device 100 in FIG. 1A, in which second semiconductor structure 104 including the memory cell array is above first semiconductor structure 102 including the peripheral circuits, in memory device 101 in FIG. 1B, first semiconductor structure 102 including the peripheral circuit is above second semiconductor structure 104 including the memory cell array. Nevertheless, bonding interface 106 is formed vertically between first and second semiconductor structures 102 and 104 in memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

It is noted that X, Y, and Z axes are included in FIGS. 1A and 1B to further illustrate the spatial relationship of the components in memory devices 100 and 101. The substrate of the memory device includes two lateral surfaces extending laterally in the X-Y plane: a top surface on the front side of the wafer on which the semiconductor devices can be formed, and a bottom surface on the backside opposite to the front side of the wafer. The Z-axis is perpendicular to both the X and Y axes. As used herein, whether one component (e.g., a layer or a device) is "on," "above," or "below" another component (e.g., a layer or a device) of the memory device is determined relative to the substrate of the memory device in the Z-direction (the vertical direction perpendicular to the X-Y plane, e.g., the thickness direction of the substrate) when the substrate is positioned in the lowest plane of the memory device in the Z-direction. The same notion for describing the spatial relationships is applied throughout the present disclosure.

Figure 2:
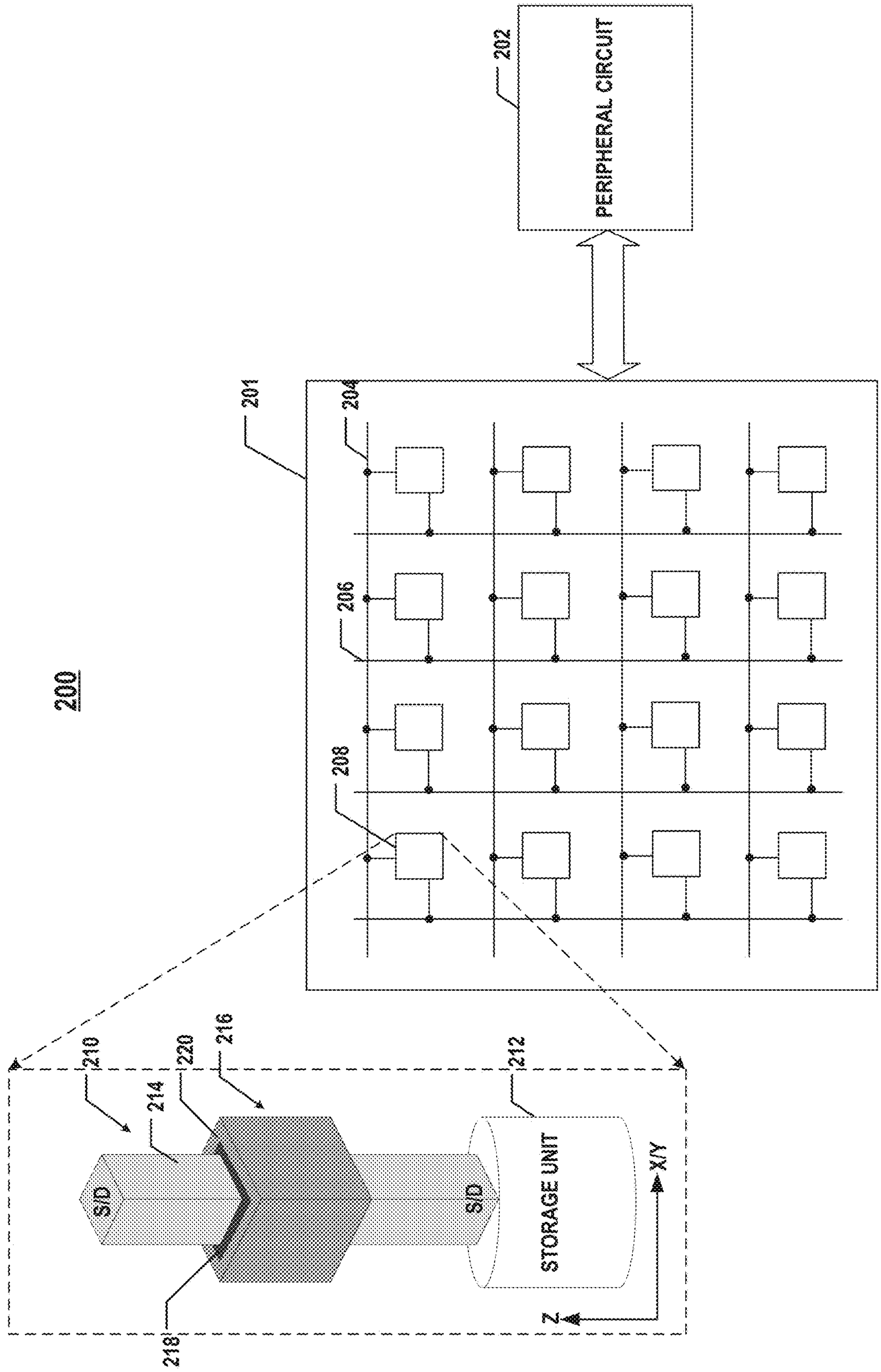
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. Memory devices 100 and 101 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace the planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the Z-direction) above the substrate (not shown). That is, semiconductor body 214 can extend above the top surface of the substrate to allow channels to be formed not only at the top surface of semiconductor body 214, but also at one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the X-Y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered as having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, e.g., in one or more planes of the side surface(s) of the active region. In other words, the active region of vertical transistor 210, e.g., semiconductor body 214, can be at least partially surrounded by gate structure 216. Gate structure 216 can include a gate dielectric 218 over one or more sides of semiconductor body 214, e.g., in contact with four side surfaces of semiconductor body 214, as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, which is a form of gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, which is a form of a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (S/D, dope regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. Since the channel is fully depleted, the leakage current ($_{I_{off}}$) of vertical transistor 210 can be significantly reduced as well. As described below in detail, the multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the X-Y plane), and the source and the drain are disposed at different locations in the same lateral plane (the X-Y plane). In contrast, in vertical transistor 210, semiconductor body 214 extends vertically (in the Z-direction), and the source and the drain are disposed in the different lateral planes, according to some implementations. In some implementations, the source and the drain are formed at two ends of semiconductor body 214 in the vertical direction (the Z-direction), respectively, thereby being overlapped in the plan view. As a result, the area (in the X-Y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells and FRAM cells, and PCM elements for PCM cells. In some implementations, vertical transistor 210 controls the selection and/or the state switch of the respective storage unit 212 coupled to vertical transistor 210.

Figure 3:
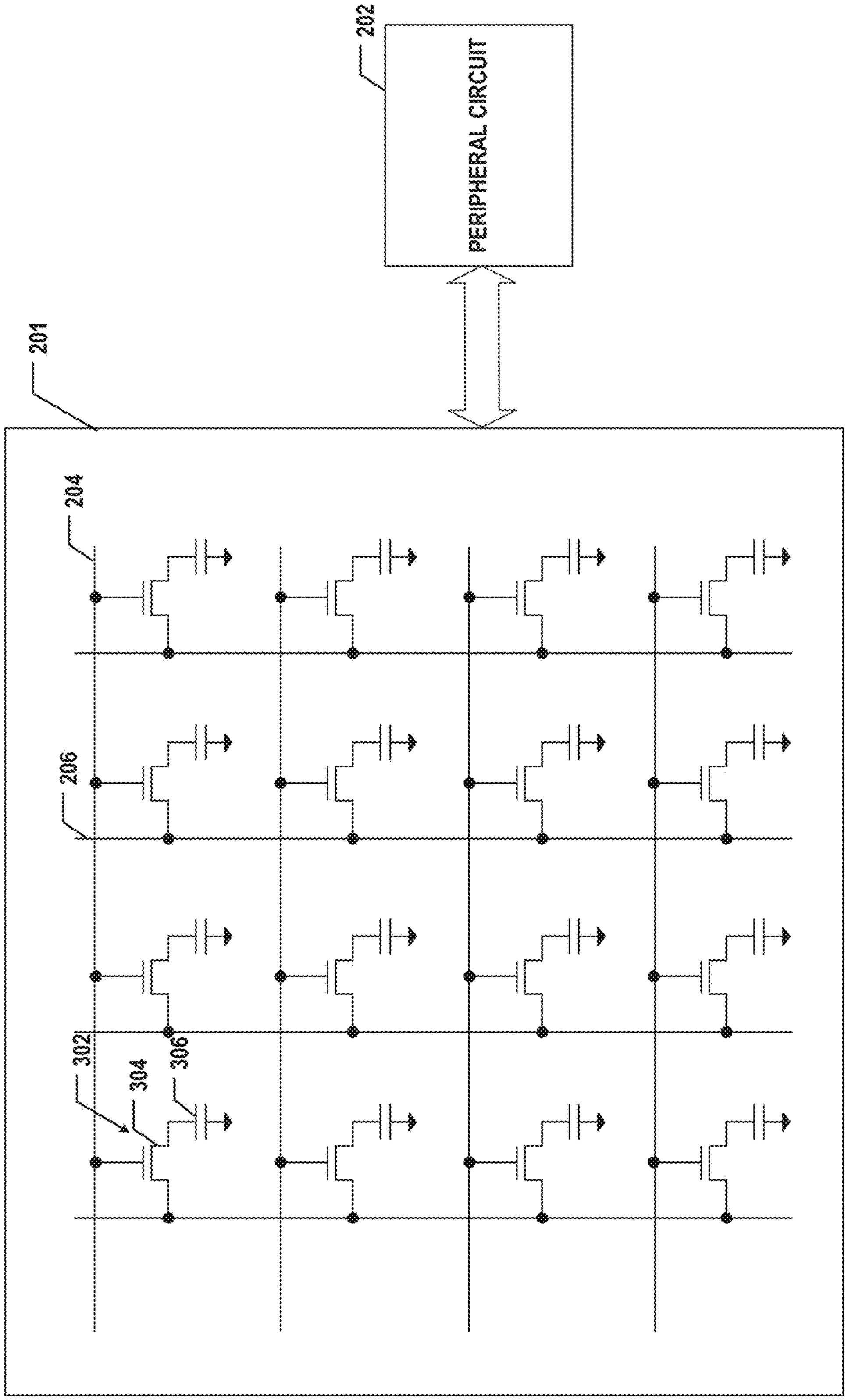
FIG. 3 illustrates a schematic circuit diagram of a memory device including peripheral circuits and an array of dynamic random-access memory (DRAM) cells, according to some aspects of the present disclosure.

FIG. 3 illustrates a schematic diagram of memory device 200 including peripheral circuits and an array of memory cells each having a vertical transistor, according to some aspects of the present disclosure. In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground.

Figure 4:
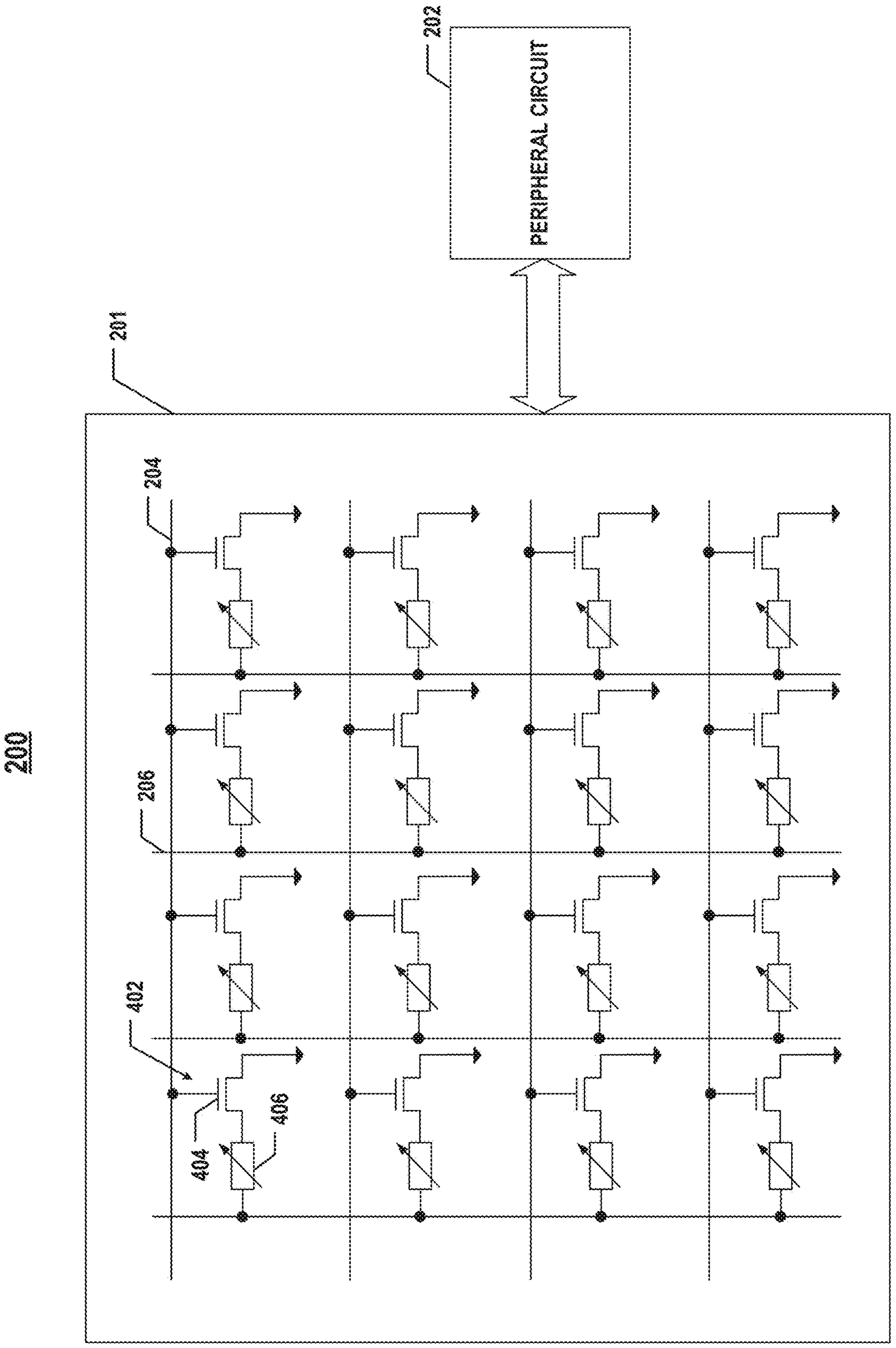
FIG. 4 illustrates a schematic circuit diagram of a memory device including peripheral circuits and an array of phase-change memory (PCM) cells, according to some aspects of the present disclosure.

FIG. 4 illustrates a schematic diagram of memory device 200 including peripheral circuits and an array of memory cells each having a vertical transistor, according to some aspects of the present disclosure. In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Figure 5:
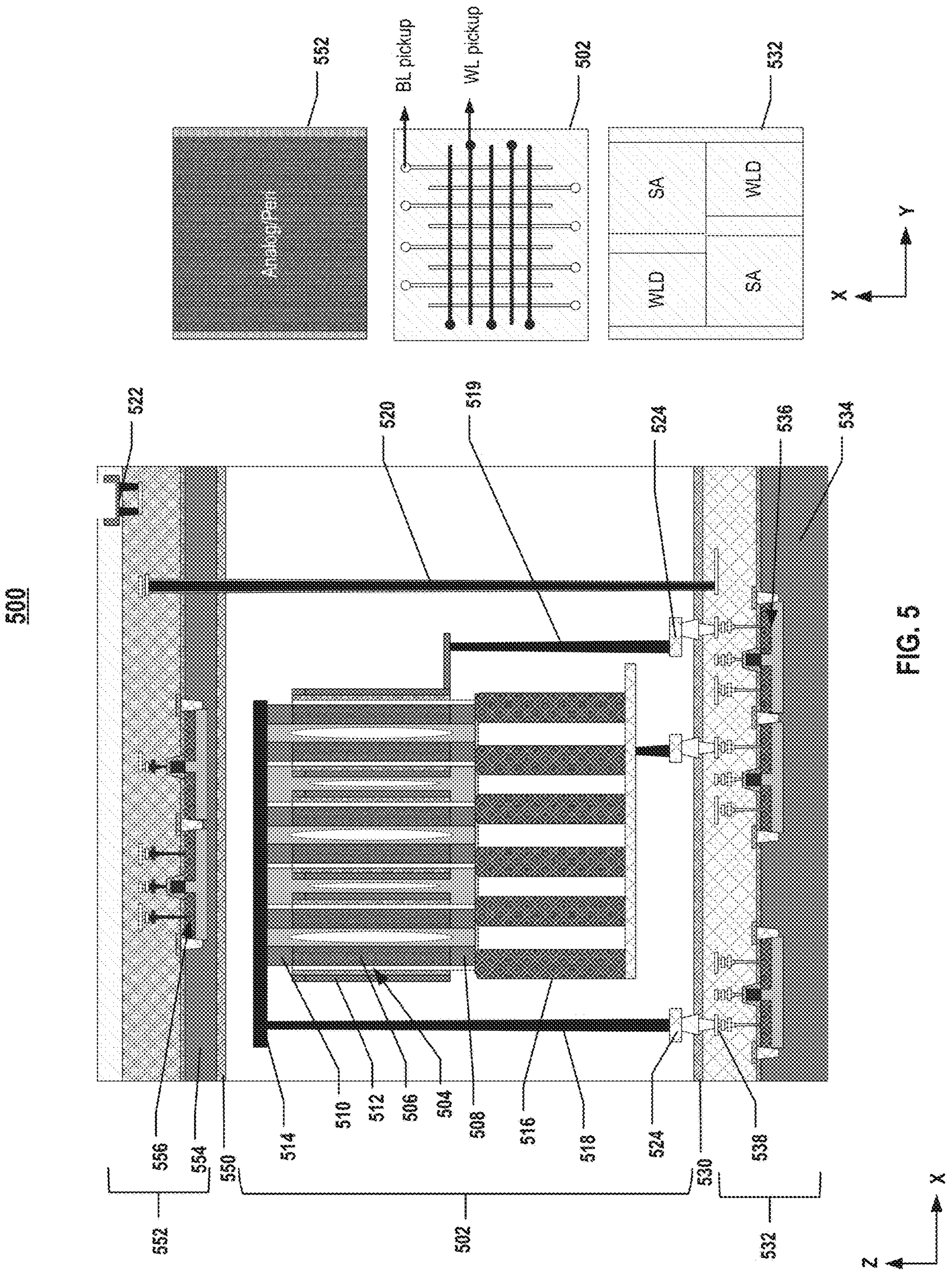
FIG. 5 illustrates a schematic view of a cross-section of a memory device, according to some aspects of the present disclosure.

FIG. 5 illustrates a schematic view of a cross-section of a memory device 500, according to some aspects of the present disclosure. As shown in FIG. 5, memory device 500 includes a memory cell 502, a first peripheral circuit 532, and a second peripheral circuit 552.

Memory cell 502 includes a vertical transistor 504 extending along the Z-direction. In some implementations, vertical transistor 504 includes a semiconductor body 506 extending in the Z-direction, a first terminal 508, e.g., the source terminal, and a second terminal 510, e.g., the drain terminal. As shown in FIG. 5, first terminal 508 and second terminal 510 are formed at two ends of semiconductor body 506 along the Z-direction, which is the stacking direction of memory cell 502, first peripheral circuit 532, and second peripheral circuit 552. Vertical transistor 504 also includes a gate structure 512 coupled to at least one side of semiconductor body 506. In some implementations, gate structure 512 may be formed on one side of semiconductor body 506, e.g., the single-side gate structure. In some implementations, gate structure 512 may be formed on two sides of semiconductor body 506, e.g., the dual gate structure. In some implementations, gate structure 512 may be formed around semiconductor body 506, e.g., the gate all around (GAA) structure. In some implementations, gate structure 512 may be a multiple-layer structure, including the gate dielectric layer, the barrier layer, and the metal gate layer.

In some implementations, memory cell 502 also includes a storage unit 516 having a first end coupled to first terminal 508 of vertical transistor 504. In some implementations, storage unit 516 may be one or more than one capacitor. A bit line 514 is coupled to second terminal 510 of vertical transistor 504. As shown in FIG. 5, a bonding interface 530 is formed between memory cell 502 and first peripheral circuit 532, and a bonding interface 550 is formed between memory cell 502 and second peripheral circuit 552. In some implementations, bonding interface 530 may be a boundary between memory cell 502 and first peripheral circuit 532, and bonding interface 550 may be a boundary between memory cell 502 and second peripheral circuit 552. In some implementations, bonding interface 530 and bonding interface 550 may be interfaces during the bonding operations between memory cell 502 and first peripheral circuit 532, and between memory cell 502 and second peripheral circuit 552. In some implementations, bit line 514 is disposed between vertical transistor 504 and bonding interface 550.

In some implementations, first peripheral circuit 532 (e.g., control and sensing circuits 536) and second peripheral circuit 552 (e.g., analog circuits 556) can include any suitable digital, analog, and/or mixed-signal circuits used for facilitating the operations of the memory cell 502. In some implementations, first peripheral circuit 532 may include one or more of a sense amplifier, a driver (e.g., a word line driver), any portions (e.g., a sub-circuit) of the functional circuits mentioned above, or any active or passive components of the circuit (e.g., transistors, diodes, resistors, or capacitors). In some implementations, second peripheral circuit 552 may include one or more of an analog peripheral circuit 556, a page buffer, a decoder (e.g., a row decoder and a column decoder), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors).

In some implementations, first peripheral circuit 532 may include one or more than one sense amplifier circuit and one or more than one word line driver circuit. In some implementations, second peripheral circuit 552 may include one or more than one analog circuit 556. First peripheral circuit 532 is formed on a substrate 534 using complementary metal-oxide-semiconductor (CMOS) technology, which can be implemented with logic processes (e.g., technology nodes of 90 nm, 65 nm, 60 nm, 45 nm, 32 nm, 28 nm, 22 nm, 20 nm, 16 nm, 14 nm, nm, 7 nm, 5 nm, 3 nm, 2 nm, etc.), according to some implementations. Second peripheral circuit 552 is formed on a substrate 554 using CMOS technology, which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 5, memory cell 502 may have two opposite surfaces, e.g., bonding interface 530 and bonding interface 550. In some implementations, first peripheral circuit 532 is coupled to a first surface of memory cell 502, e.g., bonding interface 530. In some implementations, second peripheral circuit 552 is coupled to a second surface of memory cell 502, e.g., bonding interface 550.

In some implementations, vertical transistor 504 is disposed between bit line 514 and storage unit 516 along the Z-direction. In some implementations, a contact structure 520 is formed in memory device 500 extending through memory cell 502. In some implementations, contact structure 520 is in contact with first peripheral circuit 532 and second peripheral circuit 552. In some implementations, second peripheral circuit 552 may have two opposite surfaces, in which one surface is in contact with bonding interface 550 and the other surface is formed a pad structure 522.

In some implementations, a contact structure 518 is formed in memory device 500 extending along the Z-direction to connect bit line 514 to first peripheral circuit 532. In some implementations, a contact structure 519 is formed in memory device 500 extending along the Z-direction to connect gate structure 512 to first peripheral circuit 532. As shown in FIG. 5, contact structure 518 extends along the Z-direction longer than vertical transistor 504, and contact structure 519 extends along the Z-direction longer than storage unit 516. In some implementations, storage unit 516 may be disposed between vertical transistor 504 and second peripheral circuit 552 along the Z-direction. In some implementations, substrate 554 of second peripheral circuit 552 may be in contact with second bonding interface 550.

As shown in FIG. 5, vertical transistor 504 is disposed between bit line 514 and first peripheral circuit 532 along the Z-direction. In some implementations, vertical transistor 504 is disposed between bit line 514 and storage unit 516 along the Z-direction. In some implementations, storage unit 516 is disposed between vertical transistor 504 and first peripheral circuit 532 along the Z-direction. In some implementations, bit line 514 may be directly coupled to second terminal 510 of vertical transistor 504 and may extend in the X-direction perpendicular to the Z-direction. In some implementations, bonding interface 530 is arranged between memory cell 502 and first peripheral circuit 532.

In some implementations, memory device 500 further includes a redistribution layer 524 disposed between storage unit 516 and bonding interface 530. In some implementations, bit line 514 is coupled to first peripheral circuit 532 through contact structure 518 and redistribution layer 524. Contact structure 518 may extend in memory cell 502 along the Z-direction, as shown in FIG. 5. In some implementations, memory device 500 further includes a redistribution layer 538 formed in first peripheral circuit 532, and the devices in first peripheral circuit 532 may be coupled to bonding interface 530 through redistribution layer 538.

FIG. 5 further illustrates schematic diagrams of plan views of memory cell 502, first peripheral circuit 532, and second peripheral circuit 552, according to some aspects of the present disclosure. In some implementations, the plan views of memory cell 502, first peripheral circuit 532, and second peripheral circuit 552 are overlapped, and memory cell 502, first peripheral circuit 532, and second peripheral circuit 552 are bonded with each other, as shown in FIG. 5. As shown in FIG. 5, the bit lines extend along the X-direction, and the word lines extend along the Y-direction perpendicular to the X-direction. In some implementations, even bit lines and odd bit lines may be connected to the corresponding peripheral circuit from opposite side of memory cell 502 in the plan view. In some implementations, even word lines and odd word lines may be connected to the corresponding peripheral circuit from the opposite side of memory cell 502 in the plan view. For example, even bit lines and odd bit lines may be picked up at two sides of memory cell 502 in the X-direction, and even word lines and odd word lines may be picked up at two sides of memory cell 502 in the Y-direction.

As shown in FIG. 5, first peripheral circuit 532 and second peripheral circuit 552 may include any suitable digital, analog, and/or mixed-signal circuits used for facilitating the operations of memory cell 502. In some implementations, the word line driver circuits and the sense amplifier circuits may be arranged in first peripheral circuit 532, and the analog circuits may be arranged in second peripheral circuit 552. It is understood that the arrangement of the word line driver circuits, the sense amplifier circuits, and the analog circuits shown in FIG. 5 is one of the examples, and the locations may be changed according to different applications.

Figure 6:
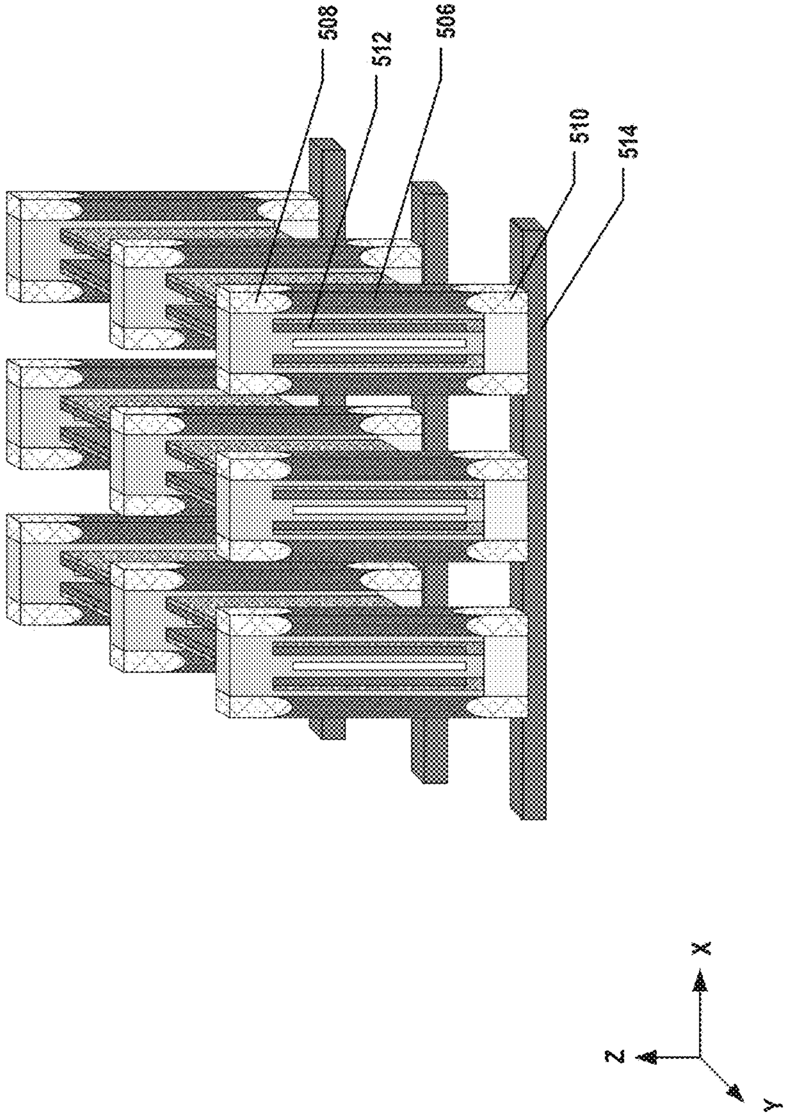
FIG. 6 illustrates a schematic diagram of a perspective view of a vertical transistor, according to some aspects of the present disclosure.
Figure 7:
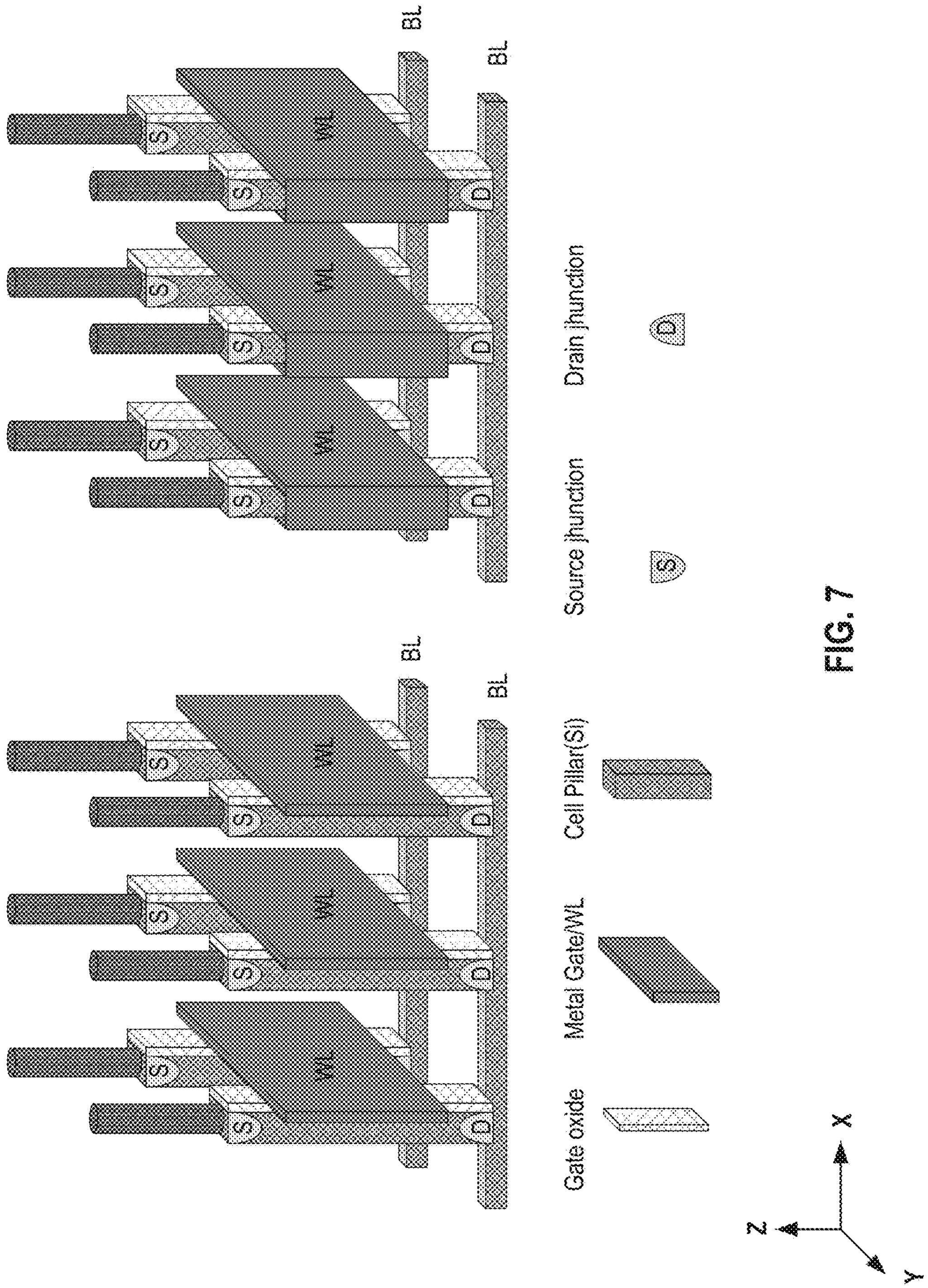
FIG. 7 illustrates schematic diagrams of perspective views of vertical transistors, according to some aspects of the present disclosure.

FIGS. 6 and 7 illustrate schematic diagrams of a perspective view of vertical transistor 504, according to some aspects of the present disclosure. As shown in FIG. 6, in some implementations, vertical transistor 504 includes semiconductor body 506 extending in the Z-direction. First terminal 508, e.g., the source terminal, and second terminal 510, e.g., the drain terminal, are formed at two ends of semiconductor body 506 along the Z-direction, which is the stacking direction of memory cell 502 and first peripheral circuit 532. In some implementations, the location of the source terminal and the drain terminal may be exchanged in different applications. For example, first terminal 508 may be the drain terminal, and second terminal 510 may be the source terminal. Vertical transistor 504 also includes gate structure 512 coupled to at least one side of semiconductor body 506.

As shown in FIG. 7, in some implementations, gate structure 512 may be formed on one side of semiconductor body 506, e.g., the single-side gate structure. In some implementations, gate structure 512 may be formed on two sides of semiconductor body 506, e.g., the dual gate structure. In some implementations, gate structure 512 may be formed around semiconductor body 506, e.g., the GAA structure. In some implementations, gate structure 512 may be a multiple-layer structure, including the gate dielectric layer, the barrier layer, and the metal gate layer.

Figure 8:
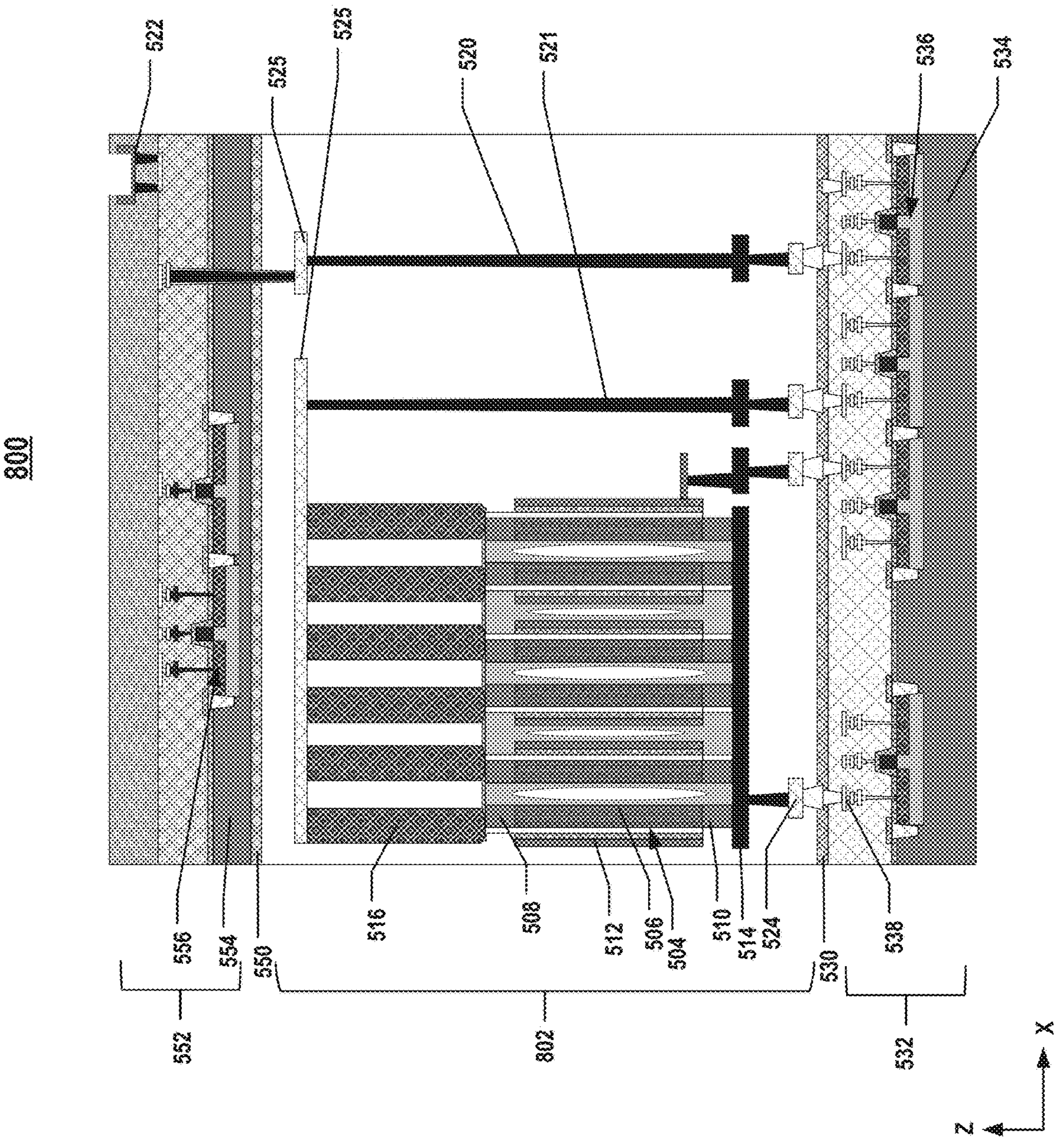
FIG. 8 illustrates a schematic view of a cross-section of a memory device, according to some aspects of the present disclosure.

FIG. 8 illustrates a schematic view of a cross-section of a memory device 800, according to some aspects of the present disclosure. As shown in FIG. 8, memory device 800 includes a memory cell 802, first peripheral circuit 532, and second peripheral circuit 552. In some implementations, first peripheral circuit 532 and second peripheral circuit 552 in FIG. 8 may be similar to first peripheral circuit 532 and second peripheral circuit 552 in FIG. 5.

As shown in FIG. 8, memory cell 802 includes vertical transistor 504 extending along the Z-direction. In some implementations, vertical transistor 504 in FIG. 8 may be similar to vertical transistor 504 in FIG. 5 but being deposed at a different location in memory cell 802. In some implementations, memory cell 802 also includes storage unit 516 having a first end coupled to first terminal 508 of vertical transistor 504. In some implementations, storage unit 516 in FIG. 8 may be similar to storage unit 516 in FIG. 5 being deposed at different location in memory cell 802. In some implementations, first bonding interface 530 is between first peripheral circuit 532 and bit line 514, and second bonding interface 550 is between second peripheral circuit 552 and storage unit 516.

As shown in FIG. 8, bit line 514 is coupled to second terminal 510 of vertical transistor 504, and bit line 514 is formed between vertical transistor 504 and bonding interface 530. In some implementations, vertical transistor 504 may be disposed between storage unit 516 and second peripheral circuit 552 along the Z-direction. Redistribution layer 524 is disposed between vertical transistor 504 and bonding interface 530, and a redistribution layer 525 is disposed at the opposite side of memory cell 802 along the Z-direction. A second end of storage unit 516 is in contact with first peripheral circuit 532 through redistribution layer 525 and a contact structure 521, and contact structure 521 extends in the Z-direction longer than vertical transistor 504. In some implementations, contact structure 521 extends in the Z-direction longer than storage unit 516.

Figure 9:
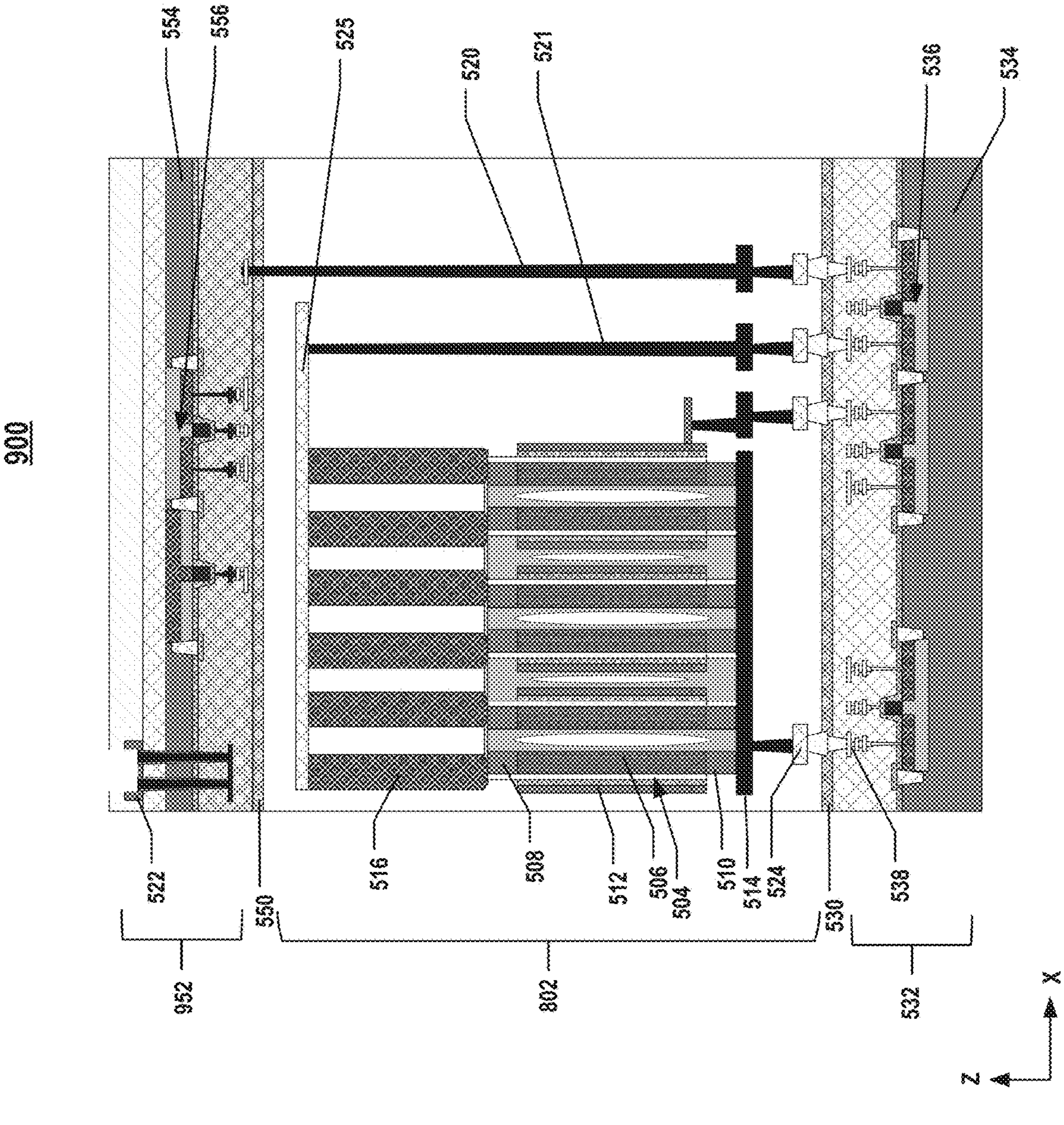
FIG. 9 illustrates a schematic view of a cross-section of a memory device, according to some aspects of the present disclosure.

FIG. 9 illustrates a schematic view of a cross-section of a memory device 900, according to some aspects of the present disclosure. As shown in FIG. 9, memory device 900 includes memory cell 802, first peripheral circuit 532, and a peripheral circuit 952. In some implementations, memory cell 802 and first peripheral circuit 532 in FIG. 9 may be similar to memory cell 802 and first peripheral circuit 532 in FIG. 8.

As shown in FIG. 9, peripheral circuit 952 may be similar to second peripheral circuit 552 but being flipped over. In other words, substrate 554 of peripheral circuit 952 does not in contact with memory cell 802 through second bonding interface 550.

Figure 10:
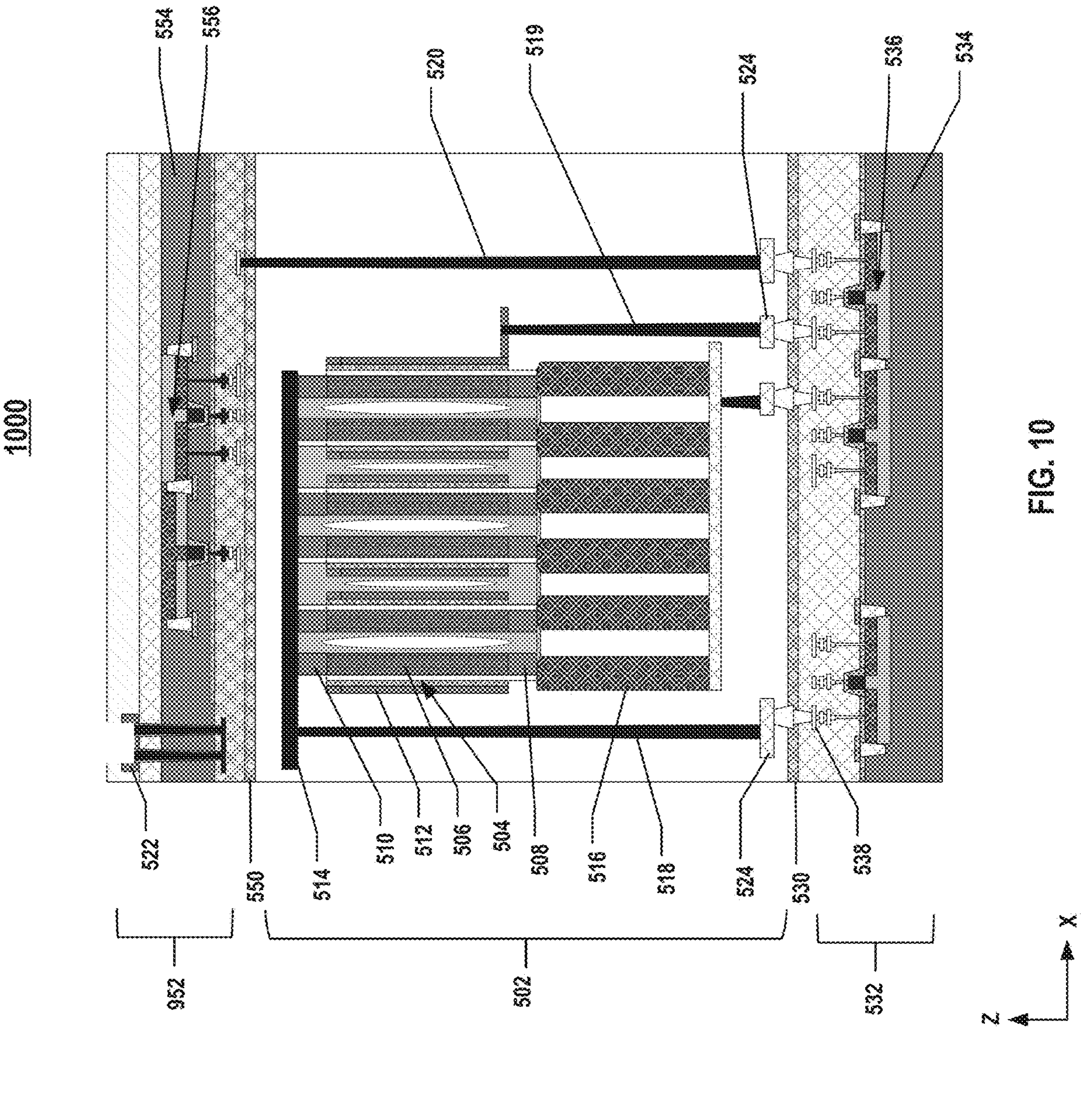
FIG. 10 illustrates a schematic view of a cross-section of a memory device, according to some aspects of the present disclosure.

FIG. 10 illustrates a schematic view of a cross-section of a memory device 1000, according to some aspects of the present disclosure. As shown in FIG. 10, memory device 1000 includes memory cell 502, first peripheral circuit 532, and peripheral circuit 952. In some implementations, memory cell 502 and first peripheral circuit 532 in FIG. 10 may be similar to memory cell 502 and first peripheral circuit 532 in FIG. 5. In some implementations, peripheral circuit 952 in FIG. 10 may be similar to peripheral circuit 952 in FIG. 9.

By forming vertical transistor 504, instead of the horizontal-cell transistor structure, bit line 514 may be formed in the array wafer. The array wafer may only have vertical transistor 504, bit line 514, and the metal redistribution layers, and all peripheral circuits including sense-amplifier, word-line (WL) driver, decoder, power, etc., are formed in the CMOS wafers. Then the array wafer and the CMOS wafers are bonded, e.g., hybrid bonded, together with high-density Cu-to-Cu bonding-via. In some implementations, two CMOS wafers may be applied: one of the CMOS wafers may include the sense amplifier, word line (WL) driver, and the other one of the CMOS wafers may include the analog circuits.

By forming bit line 514 on the first side of the cell array and storage unit 516 on the second side of the cell array, the complicated bit line process may be avoided, and the coupling capacitance between the bit lines may also be significantly reduced. Further, by using the hybrid-bonding process to bond the array wafer and the CMOS wafers, all control circuits, including the bit line control circuits, the word line control circuits, the sense amplifiers, the word line drivers/decoders, etc., may be placed above or underneath the cell array, and therefore the array efficiency can be significantly improved, and the cell size can be scaled down as well.

FIGS. 11-21 illustrate a fabrication process for forming memory device 500 including vertical transistor 504, according to some aspects of the present disclosure. FIG. 22 illustrates a flowchart of a method 2200 for forming memory device 500, according to some aspects of the present disclosure. For the purpose of better describing the present disclosure, the memory device 500 in FIGS. 11-21 and method 2200 in FIG. 22 will be discussed together. It is understood that the operations shown in method 2200 are not exhaustive and that other operations may be performed as well before, after, or between any of the illustrated operations. Further, some of the operations may be performed simultaneously, or in a different order than shown in FIGS. 11-21 and FIG. 22.

As shown in FIGS. 11-14 and operation 2202 in FIG. 22, a memory array structure, e.g., memory cell 502, is formed. The memory array structure may include vertical transistor 504 having first terminal 508 and second terminal 510, storage unit 516 having a first end coupled to first terminal 508 of vertical transistor 504, and bit line 514 coupled to second terminal 510 of vertical transistor 504.

Figure 11:
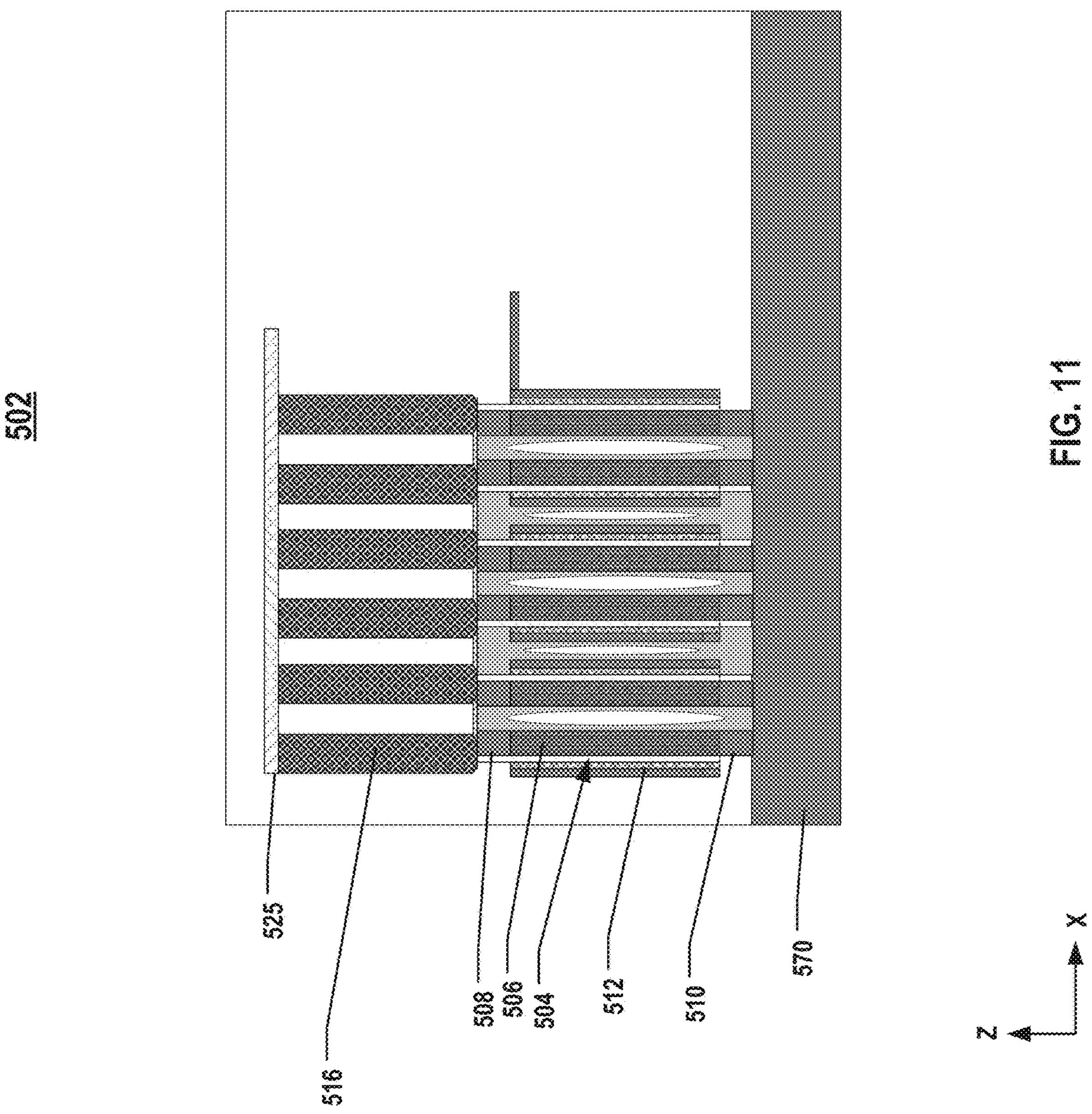
FIGS. 11-21 illustrate a fabrication process for forming a memory device including vertical transistors, according to some aspects of the present disclosure.

As shown in FIG. 11, a substrate 570 is provided, and vertical transistor 504 is formed on substrate 570. In some implementations, vertical transistor 504 includes semiconductor body 506 extending in the Z-direction. First terminal 508 and second terminal 510 may be located at both sides of semiconductor body 506. In some implementations, first terminal 508 and second terminal 510 may be the source terminal and the drain terminal of vertical transistor 504 after performing the activation operations later.

In some implementations, after forming semiconductor body 506, gate structure 512 may be formed on at least one side of semiconductor body 506. In some implementations, gate structure 512 may be a multiple-layer structure, including the gate dielectric layer, the barrier layer, and the metal gate layer. In some implementations, a planarization operation may be performed to expose semiconductor body 506.

In some implementations, to form gate structure 512, a gate dielectric is formed over the exposed part of semiconductor body 506, a conductive layer is deposited over the gate dielectric, and the conductive layer is patterned to form a gate electrode over the gate dielectric. As a result, gate structure 512 may become word lines each extending in the word line direction (the Y-direction).

Figure 15:
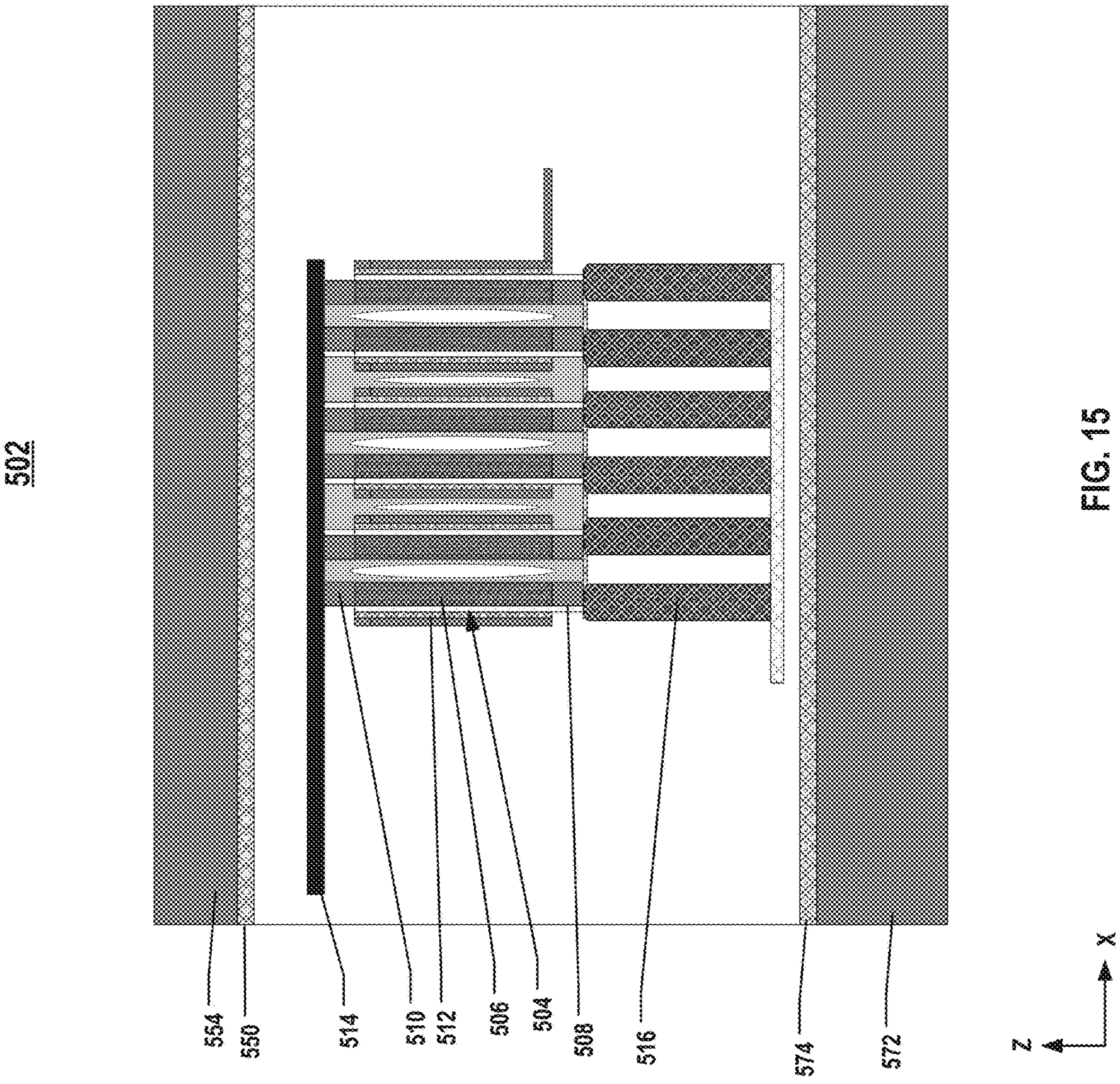

As shown in FIG. 11, storage unit 516 is formed on first terminal 508. In some implementations, before forming storage unit 516 on first terminal 508, first terminal 508 of semiconductor body 506 may be doped to form a source/drain terminal, e.g., a source terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on first terminal 508 by performing a silicidation process at the exposed end of semiconductor body 506. Then, storage unit 516 is formed on first terminal 508, and one end of a plurality of storage unit 516 is connected, as shown in FIG. 15.

As shown in FIG. 11, redistribution layer 525 is formed on storage unit 516. In some implementations, storage unit 516 is located between vertical transistor 504 and redistribution layer 525 along the Z-direction.

Figure 12:
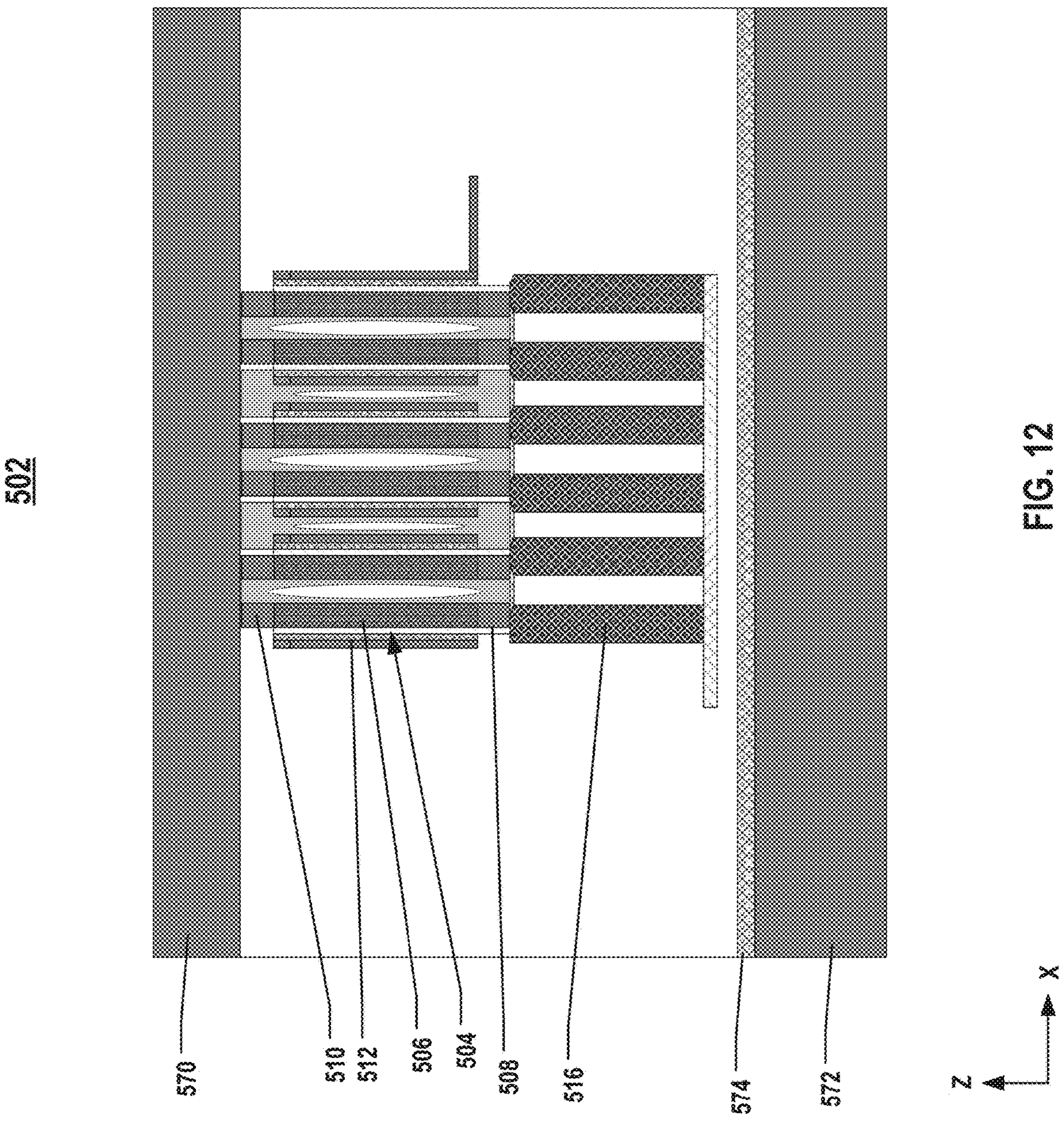
Figure 13:
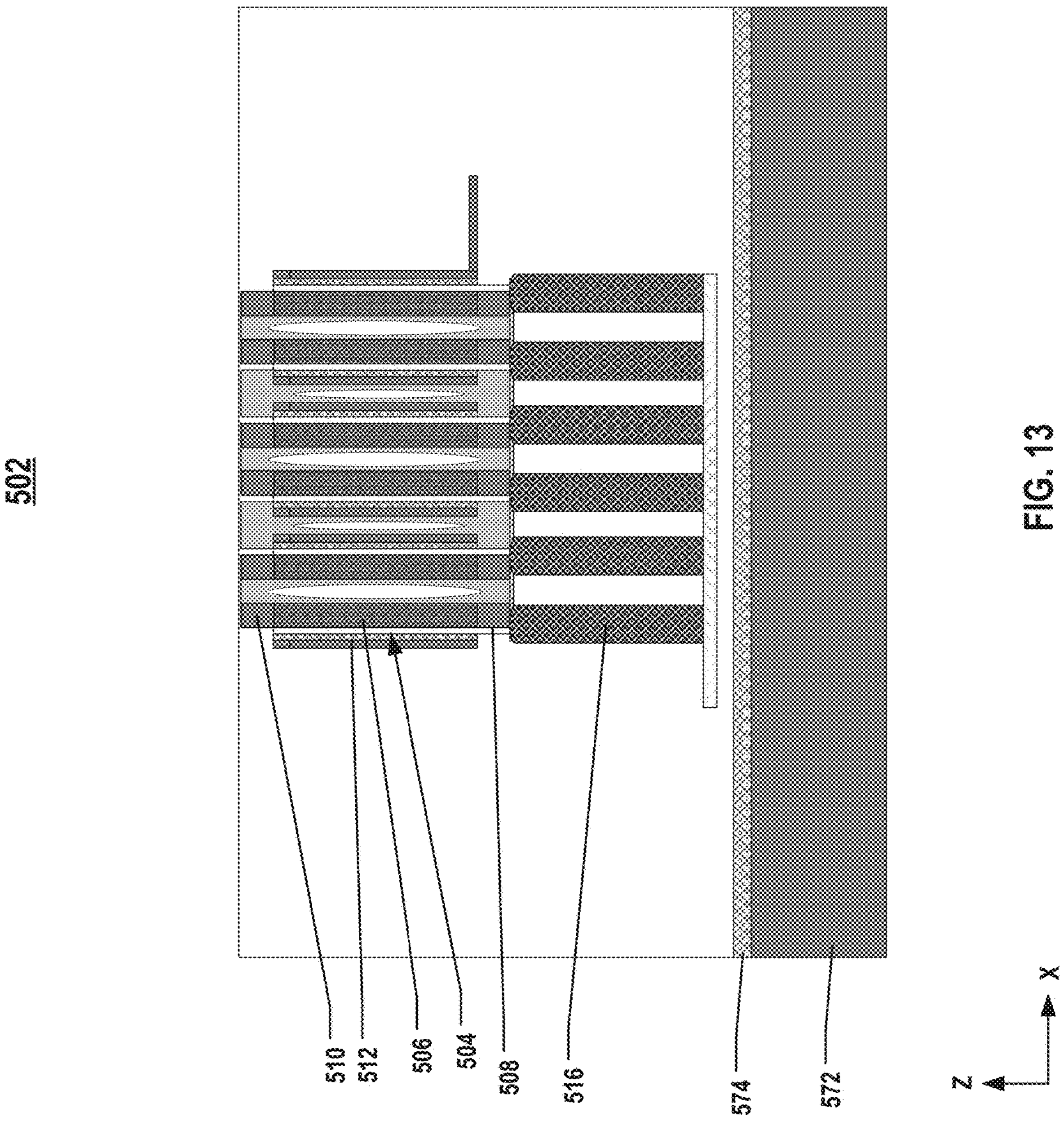

As shown in FIG. 12, a substrate 572 is bonded to memory cell 502 having a bonding interface 574. Substrate 572 may be used as the carrier wafer in the following operation of forming the bit line. Then, as shown in FIG. 13, substrate 570 is removed to expose second terminal 510 of vertical transistor 504. In some implementations, an implantation process and/or thermal diffusion process are performed to dope P-type dopants or N-type dopants to exposed second terminal 510 to form the source/drain terminal. In some implementations, a silicide layer is formed on second terminal 510 by performing a silicidation process at the exposed end of semiconductor body 506.

Figure 14:
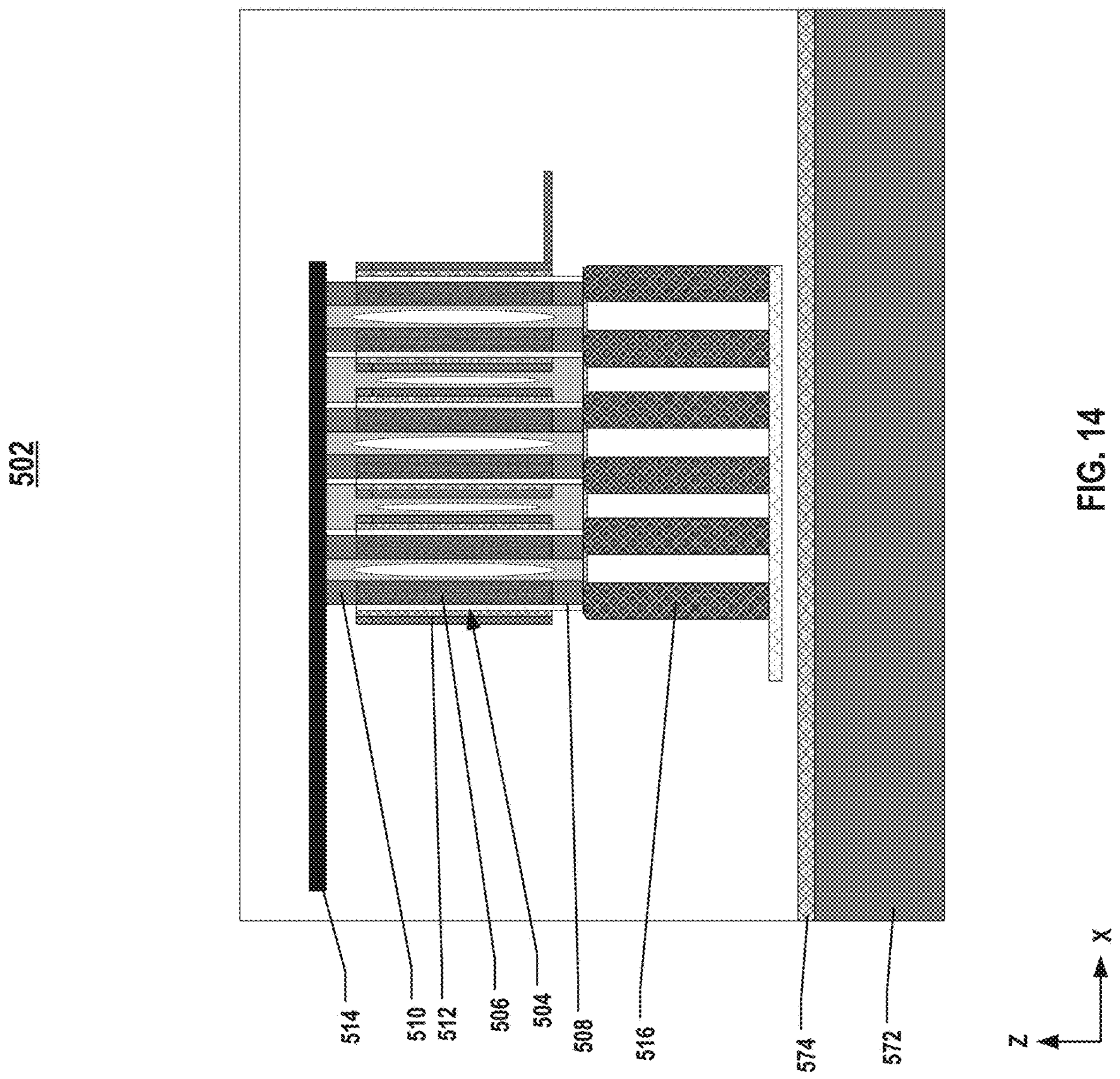

As shown in FIG. 14, bit line 514 is formed on second terminal 510 of vertical transistor 504. In some implementations, the lead out method of the bit lines and the word lines may be similar to the word line/bit line lead out shown in FIG. 5. For example, the bit lines extend along the X-direction, and the word lines extend along the Y-direction perpendicular to the X-direction. In some implementations, even bit lines and odd bit lines may be connected to the corresponding peripheral circuit from the opposite side of memory cell 502 in the plan view. In some implementations, even word lines and odd word lines may be connected to the corresponding peripheral circuit from the opposite side of memory cell 502 in the plan view. For example, even bit lines and odd bit lines may be picked up at two sides of memory cell 502 in the X-direction, and even word lines and odd word lines may be picked up at two sides of memory cell 502 in the Y-direction.

Figure 16:
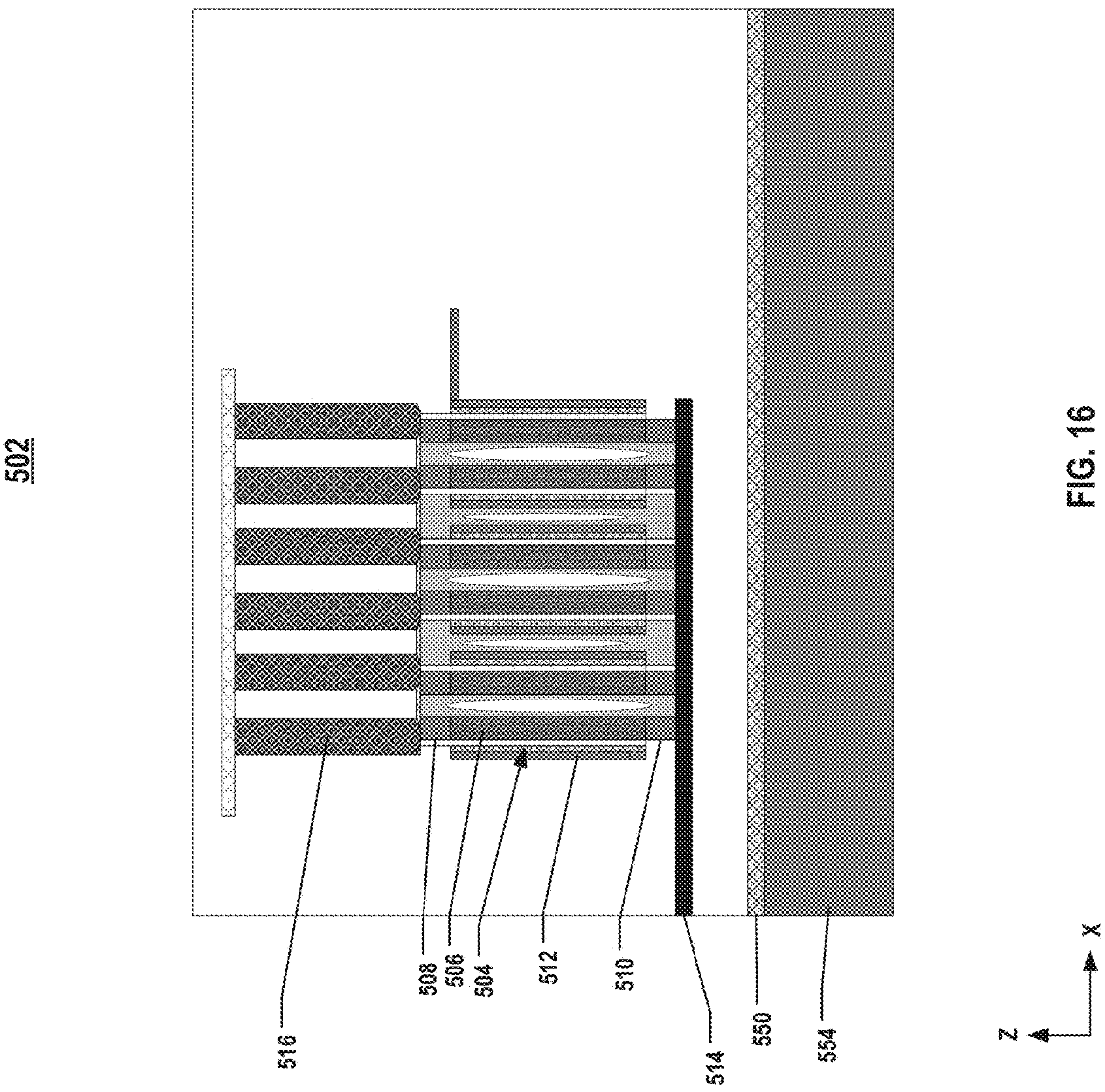

As shown in FIG. 15, substrate 554 is bonded to memory cell 502 having bonding interface 550. In some implementations, substrate 554 may be used as a carrier wafer in the following operations, and may also be used as a semiconductor substrate for forming the CMOS wafer in the later operations. As shown in FIG. 16, substrate 572 is then removed. In some implementations, substrate 572 may be removed by using wet etching, dry etch, or chemical mechanical polishing (CMP) operations.

Figure 17:
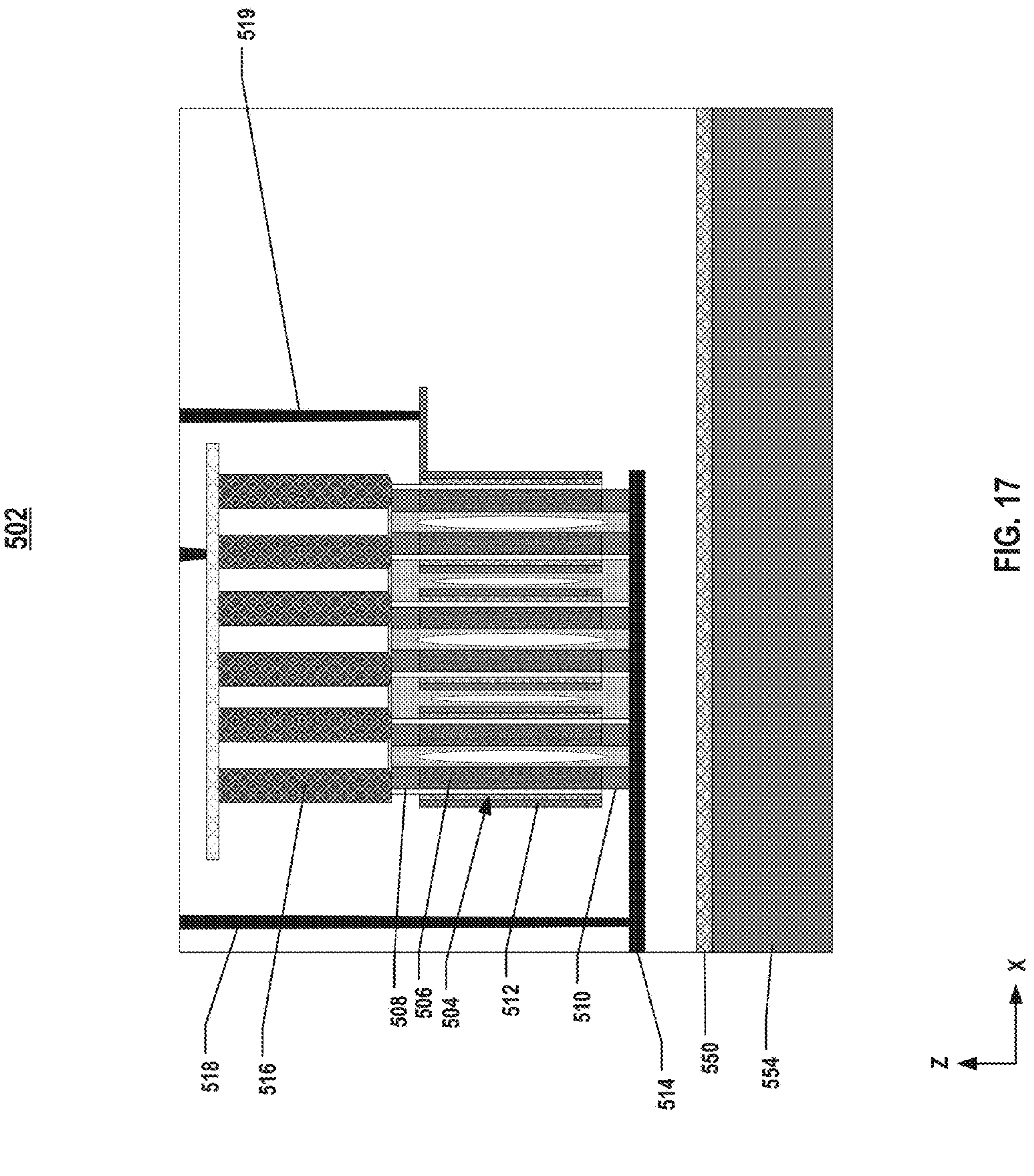

Then, as shown in FIG. 17 and operation 2204 in FIG. 22, contact structure 518 and contact structure 519 are formed in memory cell 502. In some implementations, contact structure 518 is formed in contact with bit line 514, and contact structure 519 may be formed in contact with gate structure 512.

Figure 18:
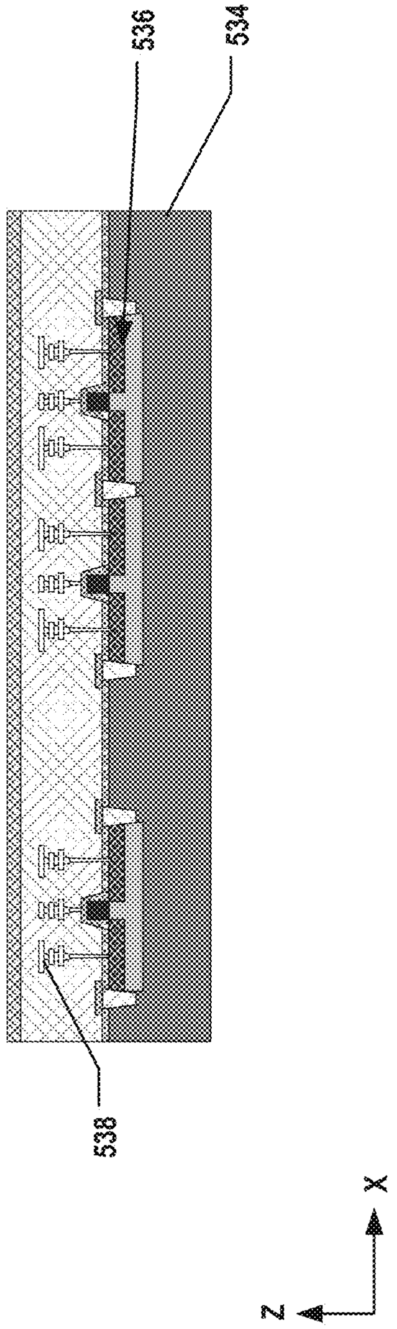
Figure 19:
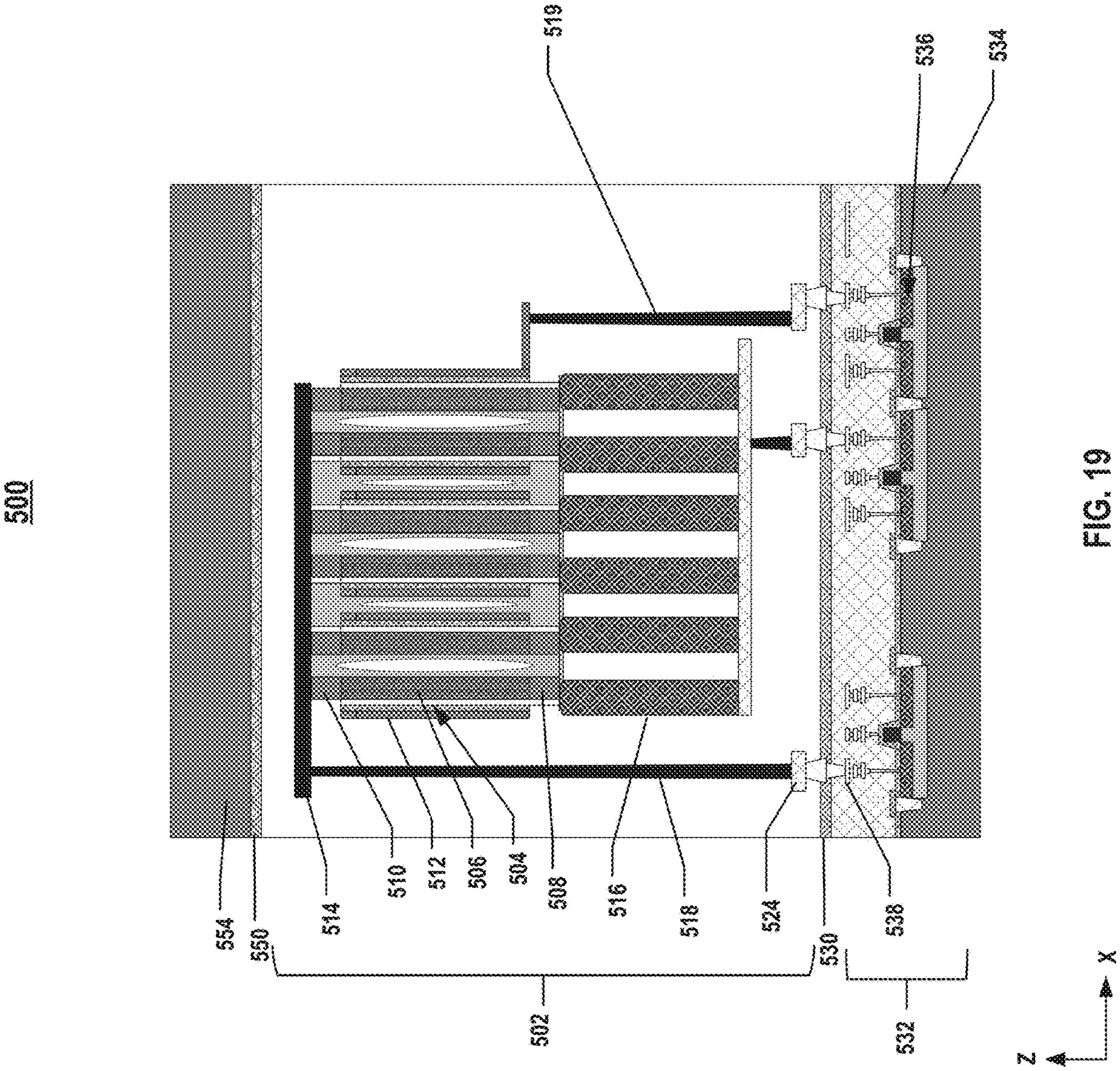

As shown in FIGS. 18-19 and operation 2206 in FIG. 22, first peripheral circuit 532 is formed on substrate 534 and then is bonded with the memory array structure. First peripheral circuit 532 includes control and sensing circuits 536. In some implementations, first peripheral circuit 532 may include any suitable digital, analog, and/or mixed-signal circuits used for facilitating the operations of the memory cell 502. In some implementations, first peripheral circuit 532 may include one or more of a sense amplifier, a driver (e.g., a word line driver), any portions (e.g., a sub-circuit) of the functional circuits mentioned above, or any active or passive components of the circuit (e.g., transistors, diodes, resistors, or capacitors).

In some implementations, first peripheral circuit 532 may be bonded with memory cell 502 vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously.

It is understood that the forming process of first peripheral circuit 532 and memory cell 502 may be performed separately. In some implementations, the forming process of first peripheral circuit 532 and memory cell 502 may be performed simultaneously or sequentially and is not limited here. In other words, operations 2202-2204 and operation 2206 may be performed simultaneously or sequentially.

Figure 20:
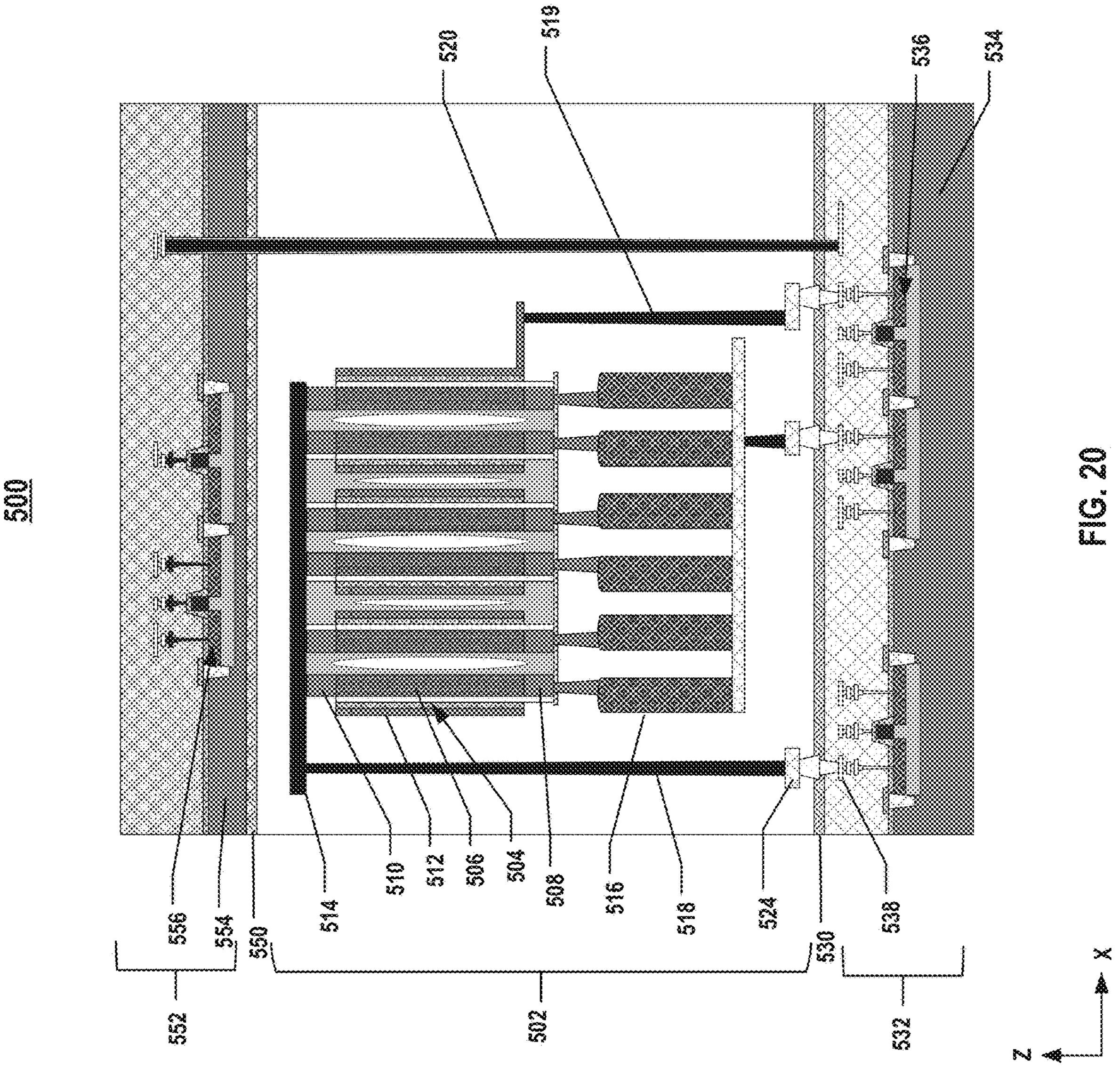

As shown in FIG. 20 and operation 2208 in FIG. 22, second peripheral circuit 552 may be formed in contact with the memory array structure. In some implementations, substrate 554 may be thinned to a predefined thickness. In some implementations, because a through silicon via (TSV) structure, e.g., contact structure 520, may be formed extending through substrate 554 in a later operation, substrate 554 needs to be thinned before forming second peripheral circuit 552 in substrate 554. After forming second peripheral circuit 552 in substrate 554, contact structure 520 may be formed in memory device 500. In some implementations, contact structure 520 extends through substrate 554. In some implementations, contact structure 520 extends through memory cell 502. In some implementations, contact structure 520 is in contact with first peripheral circuit 532 and second peripheral circuit 552.

Figure 21:
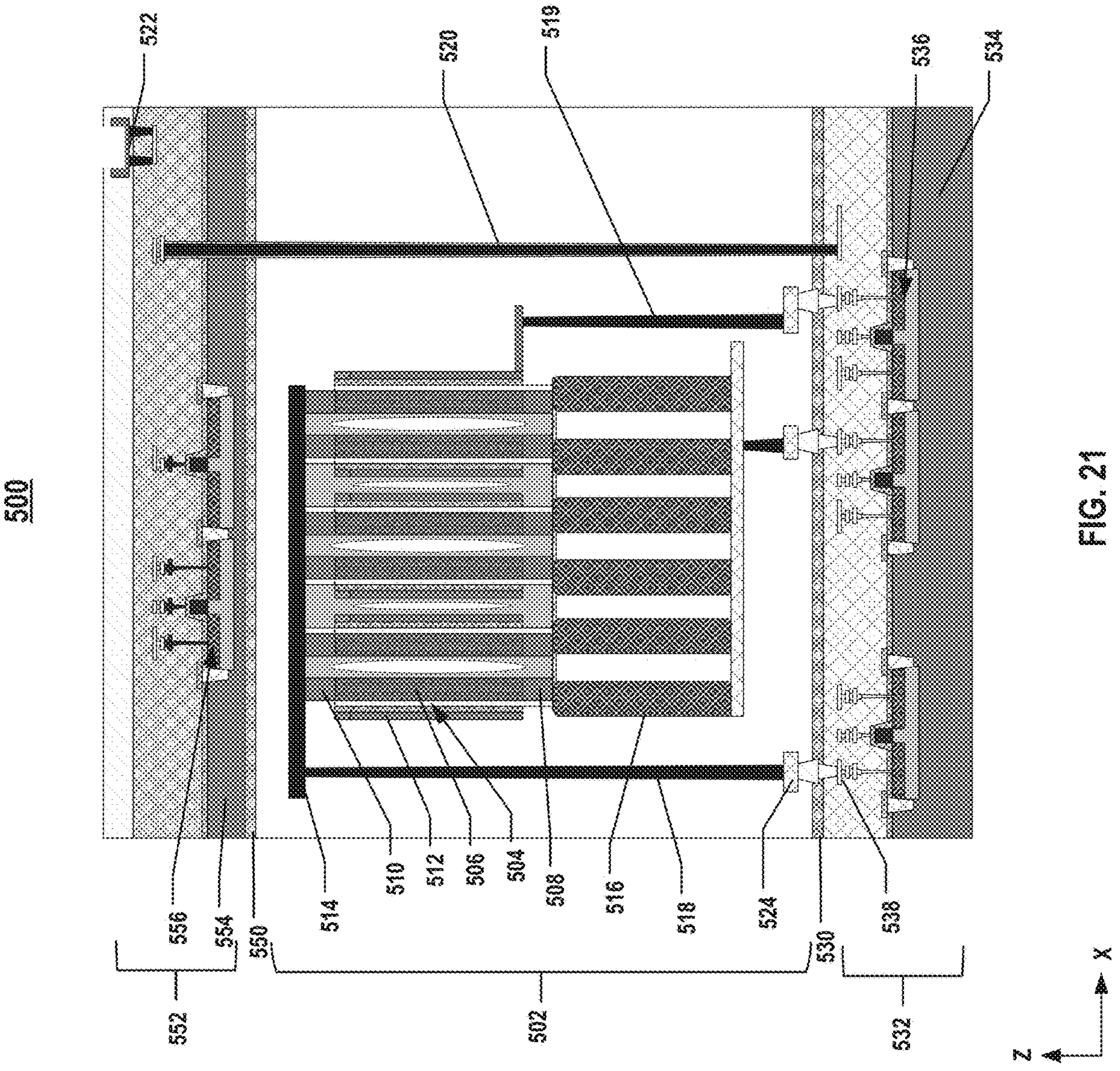
Figure 22:
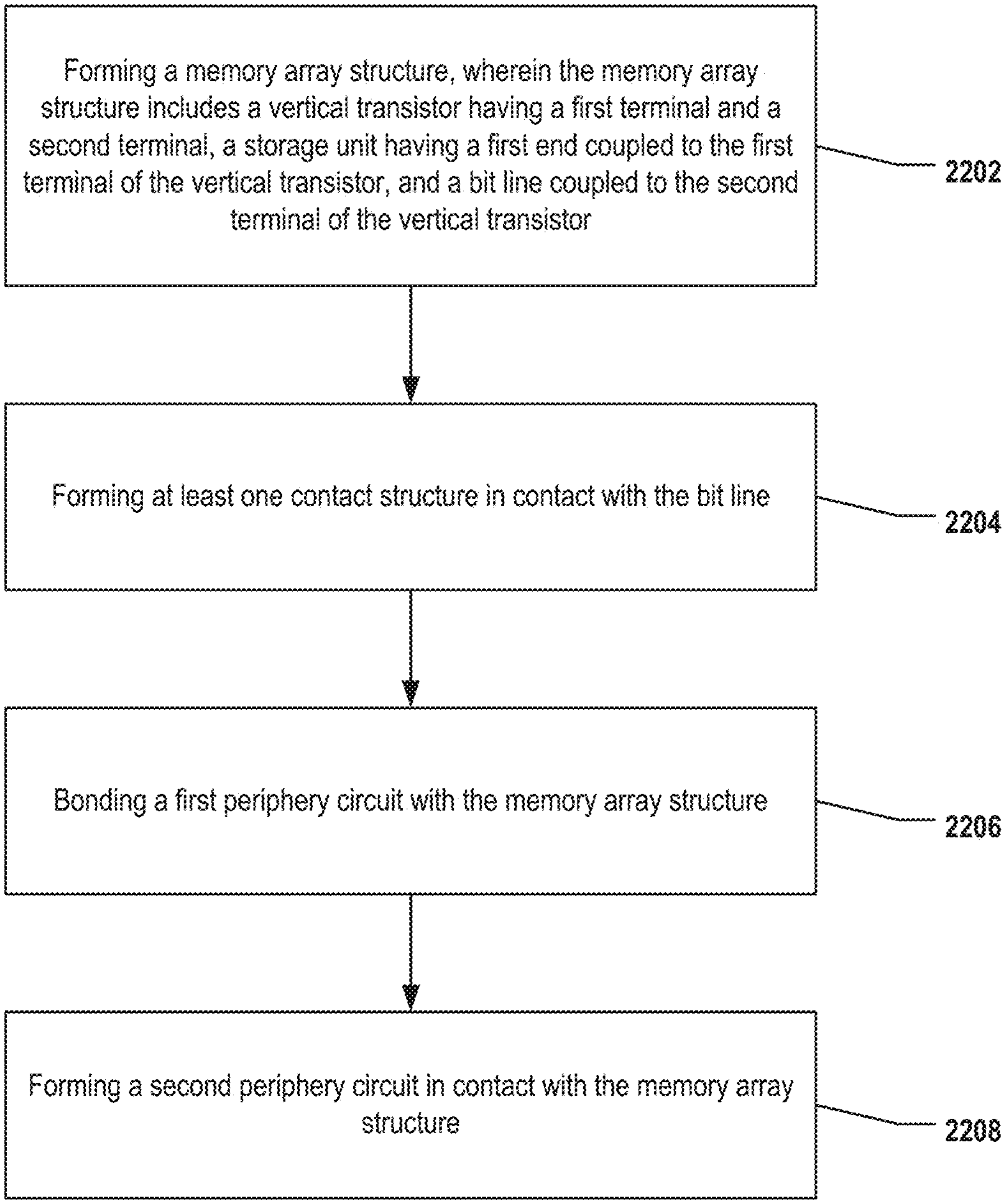
FIG. 22 illustrates a flowchart of a method for forming a memory device, according to some aspects of the present disclosure.

As shown in FIG. 21, pad structure 522 is then formed on second peripheral circuit 552. In some implementations, one side of second peripheral circuit 552 is in contact with memory cell 502, and pad structure 522 is formed on the other side of second peripheral circuit 552.

FIGS. 23-28 illustrate a fabrication process for forming memory device 900 including vertical transistor 504, according to some aspects of the present disclosure. FIG. 29 illustrates a flowchart of a method 2900 for forming memory device 900, according to some aspects of the present disclosure. For the purpose of better describing the present disclosure, the memory device 900 in FIGS. 23-28 and method 2900 in FIG. 29 will be discussed together. It is understood that the operations shown in method 2900 are not exhaustive and that other operations may be performed as well before, after, or between any of the illustrated operations. Further, some of the operations may be performed simultaneously, or in a different order than shown in FIGS. 23-28 and FIG. 29.

Figure 23:
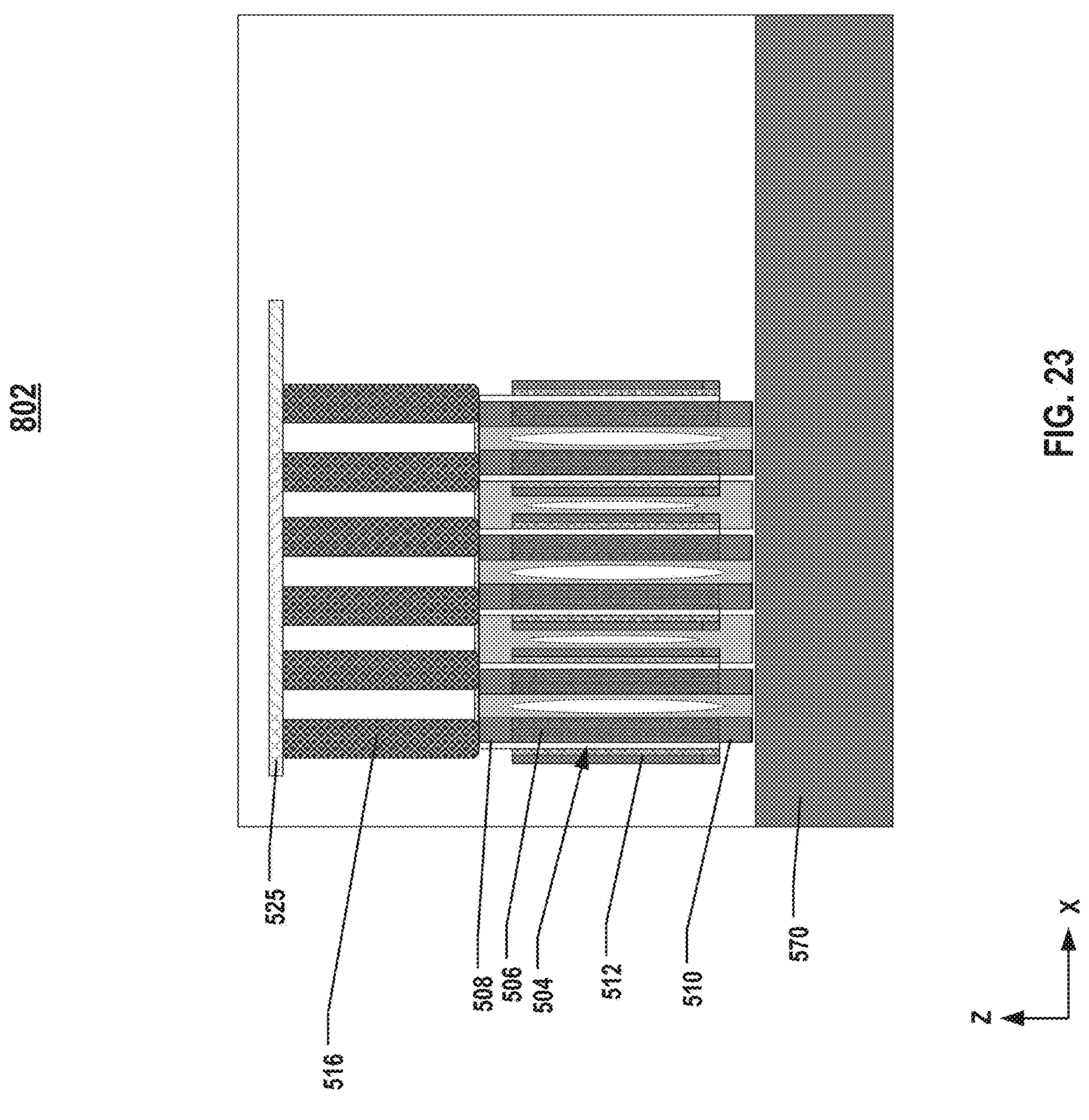
FIGS. 23-28 illustrate a fabrication process for forming a memory device including vertical transistors, according to some aspects of the present disclosure.

As shown in FIG. 23 and operation 2902 in FIG. 29, a memory array structure, e.g., memory cell 802, is formed. The memory array structure may include vertical transistor 504 having first terminal 508 and second terminal 510, storage unit 516 having a first end coupled to first terminal 508 of vertical transistor 504, and bit line 514 coupled to second terminal 510 of vertical transistor 504.

As shown in FIG. 23, substrate 570 is provided, and vertical transistor 504 is formed on substrate 570. In some implementations, vertical transistor 504 includes semiconductor body 506 extending in the Z-direction. First terminal 508 and second terminal 510 may be located on both sides of semiconductor body 506. In some implementations, first terminal 508 and second terminal 510 may be the source terminal and the drain terminal of vertical transistor 504 after performing the activation operations later.

In some implementations, after forming semiconductor body 506, gate structure 512 may be formed on at least one side of semiconductor body 506. In some implementations, gate structure 512 may be a multiple-layer structure, including the gate dielectric layer, the barrier layer, and the metal gate layer. In some implementations, a planarization operation may be performed to expose semiconductor body 506.

In some implementations, to form gate structure 512, a gate dielectric is formed over the exposed part of semiconductor body 506, a conductive layer is deposited over the gate dielectric, and the conductive layer is patterned to form a gate electrode over the gate dielectric. As a result, gate structure 512 may become word lines each extending in the word line direction (the Y-direction).

As shown in FIG. 23, storage unit 516 is formed on first terminal 508. In some implementations, before forming storage unit 516 on first terminal 508, first terminal 508 of semiconductor body 506 may be doped to form a source/drain terminal, e.g., a source terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on first terminal 508 by performing a silicidation process at the exposed end of semiconductor body 506. Then, storage unit 516 is formed on first terminal 508, and one end of a plurality of storage unit 516 is connected. As shown in FIG. 23, redistribution layer 525 is formed on storage unit 516. In some implementations, storage unit 516 is located between vertical transistor 504 and redistribution layer 525 along the Z-direction.

As shown in operation 2904 in FIG. 29, peripheral circuit 952 is formed on substrate 554. In some implementations, peripheral circuit 952 may include one or more of an analog peripheral circuit 556, a page buffer, a decoder (e.g., a row decoder and a column decoder), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). In some implementations, peripheral circuit 952 may include one or more analog circuits 556. Peripheral circuit 952 is formed on substrate 554 using CMOS technology, which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

Figure 24:
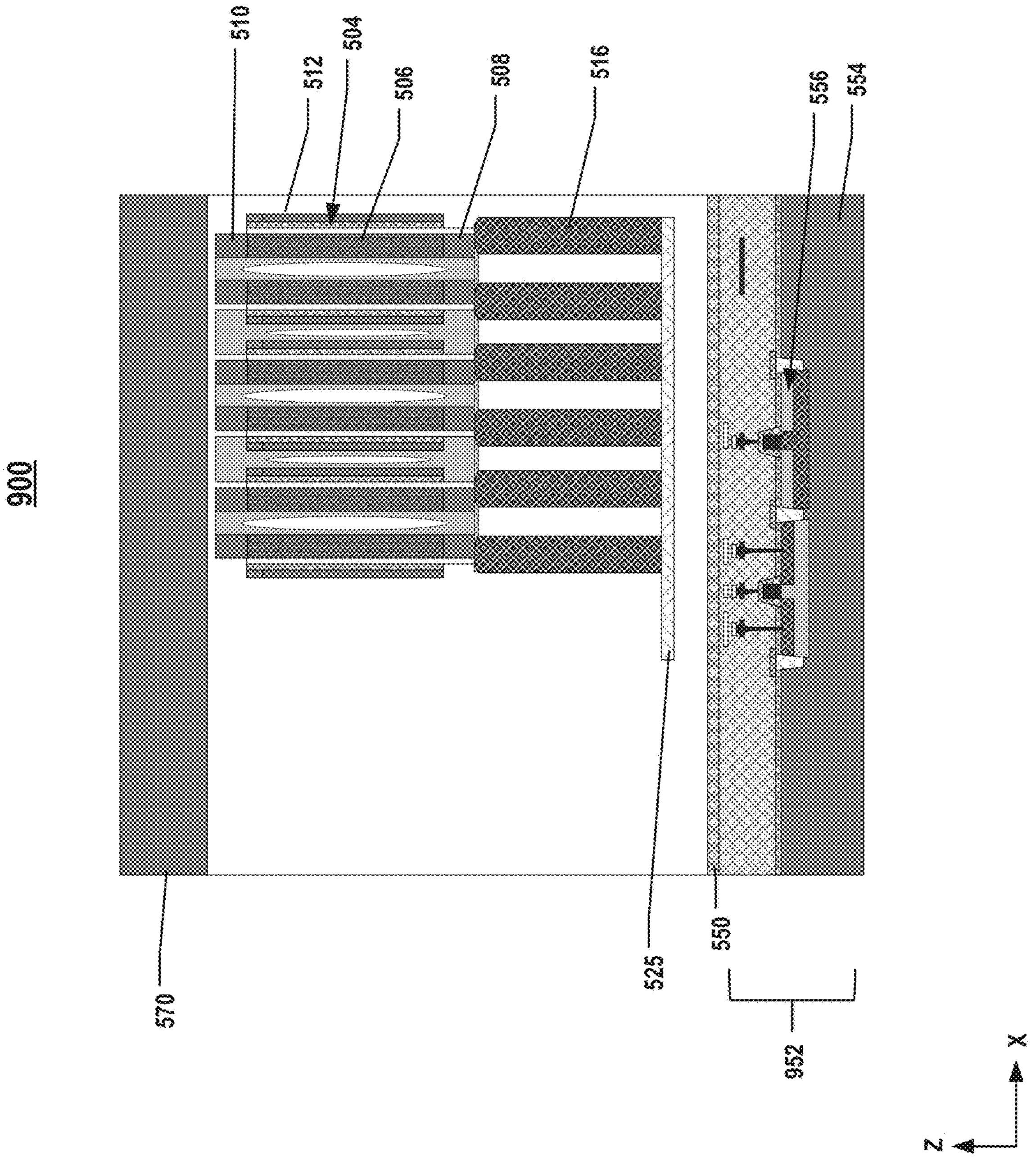

As shown in FIG. 24 and operation 2906 in FIG. 29, the memory array structure is bonded with peripheral circuit 952 having bonding interface 550. In some implementations, a second end of storage unit 516 faces peripheral circuit 952. In some implementations, peripheral circuit 952 may be bonded with memory cell 802 vertically through bonding (e.g., hybrid bonding) according to some implementations. Hybrid bonding, also known as “metal/dielectric hybrid bonding,” is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously.

It is understood that the forming process of peripheral circuit 952 and memory cell 802 may be performed separately. In some implementations, the forming process of peripheral circuit 952 and memory cell 802 may be performed simultaneously or sequentially and is not limited here. In other words, operations 2902 and operation 2904 may be performed simultaneously or sequentially.

Figure 25:
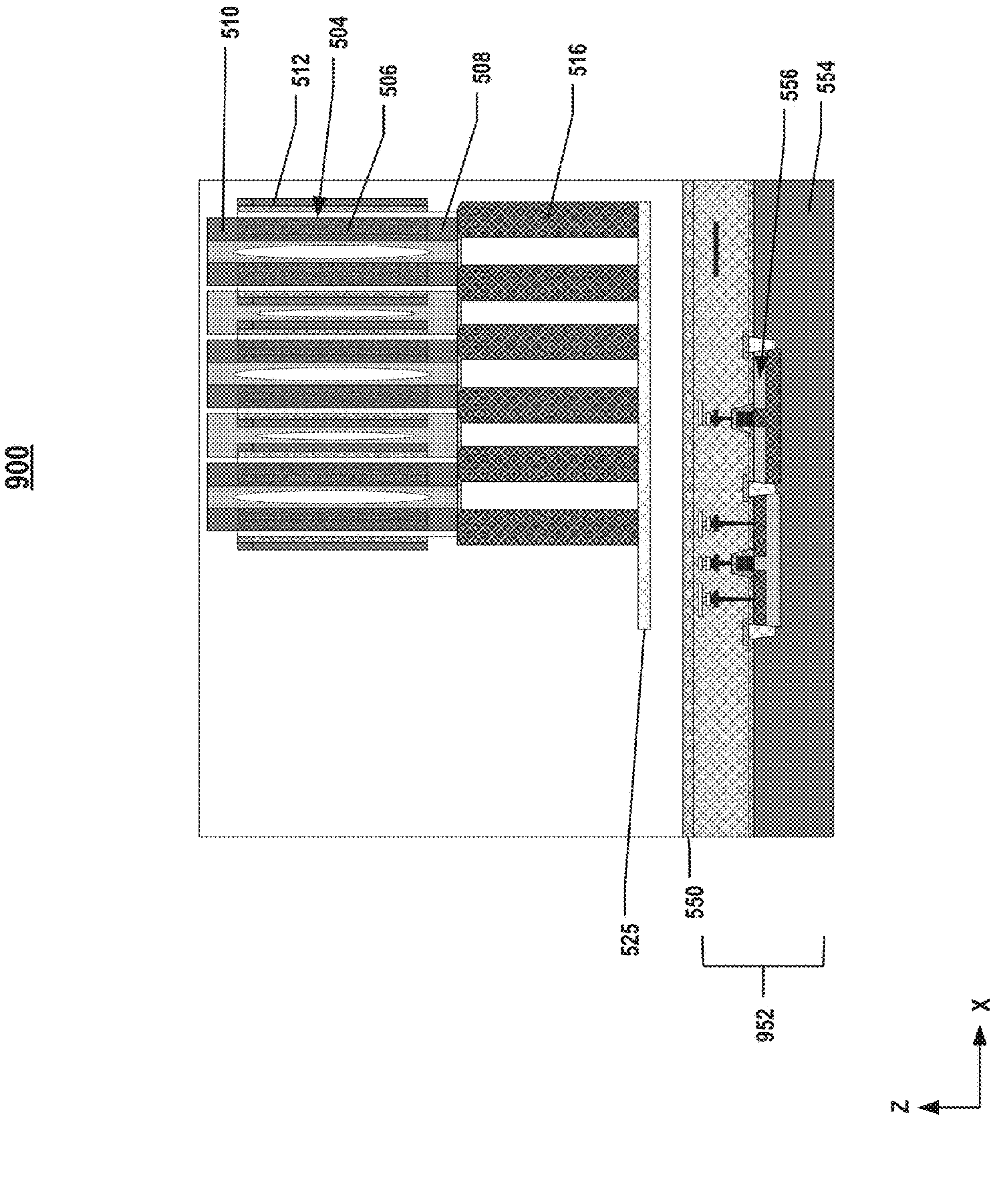

As shown in FIG. 25 and operation 2908 in FIG. 29, substrate 570 is removed. In some implementations, substrate 570 may be removed by using wet etching, dry etch, or CMP operations. Then, in some implementations, an implantation process and/or thermal diffusion process are performed to dope P-type dopants or N-type dopants to the exposed second terminal 510 to form the source/drain terminal. In some implementations, a silicide layer is formed on second terminal 510 by performing a silicidation process at the exposed end of semiconductor body 506.

Figure 26:
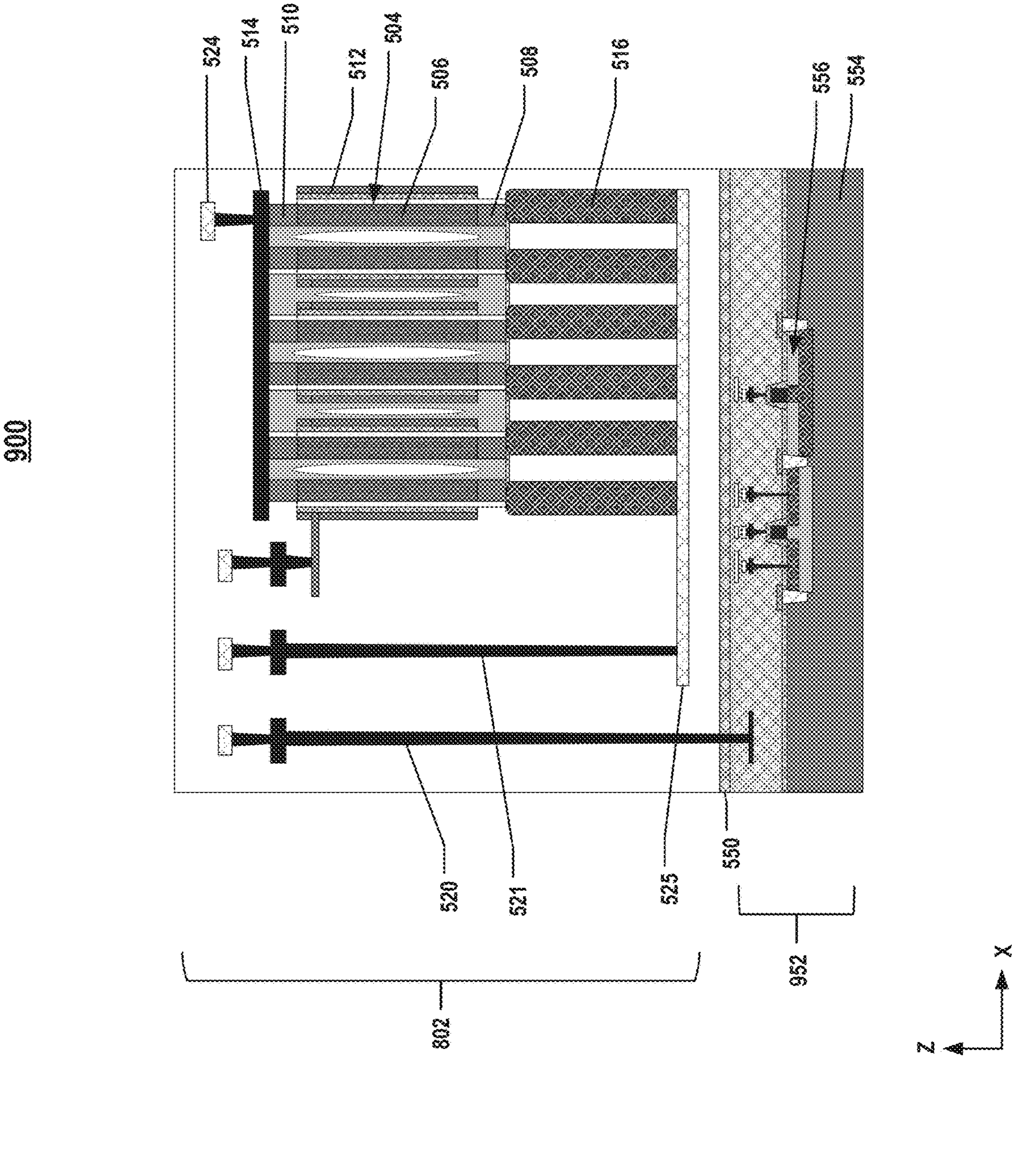

As shown in FIG. 26 and operation 2910 in FIG. 29, bit line 514 is formed in contact with second terminal 510 of vertical transistor 504. In some implementations, contact structure 520 and contact structure 521 may be formed in memory cell 802 extending along the Z-direction. In some implementations, contact structure 520 may extend to peripheral circuit 952. In some implementations, contact structure 521 may extend in contact with redistribution layer 525.

Figure 27:
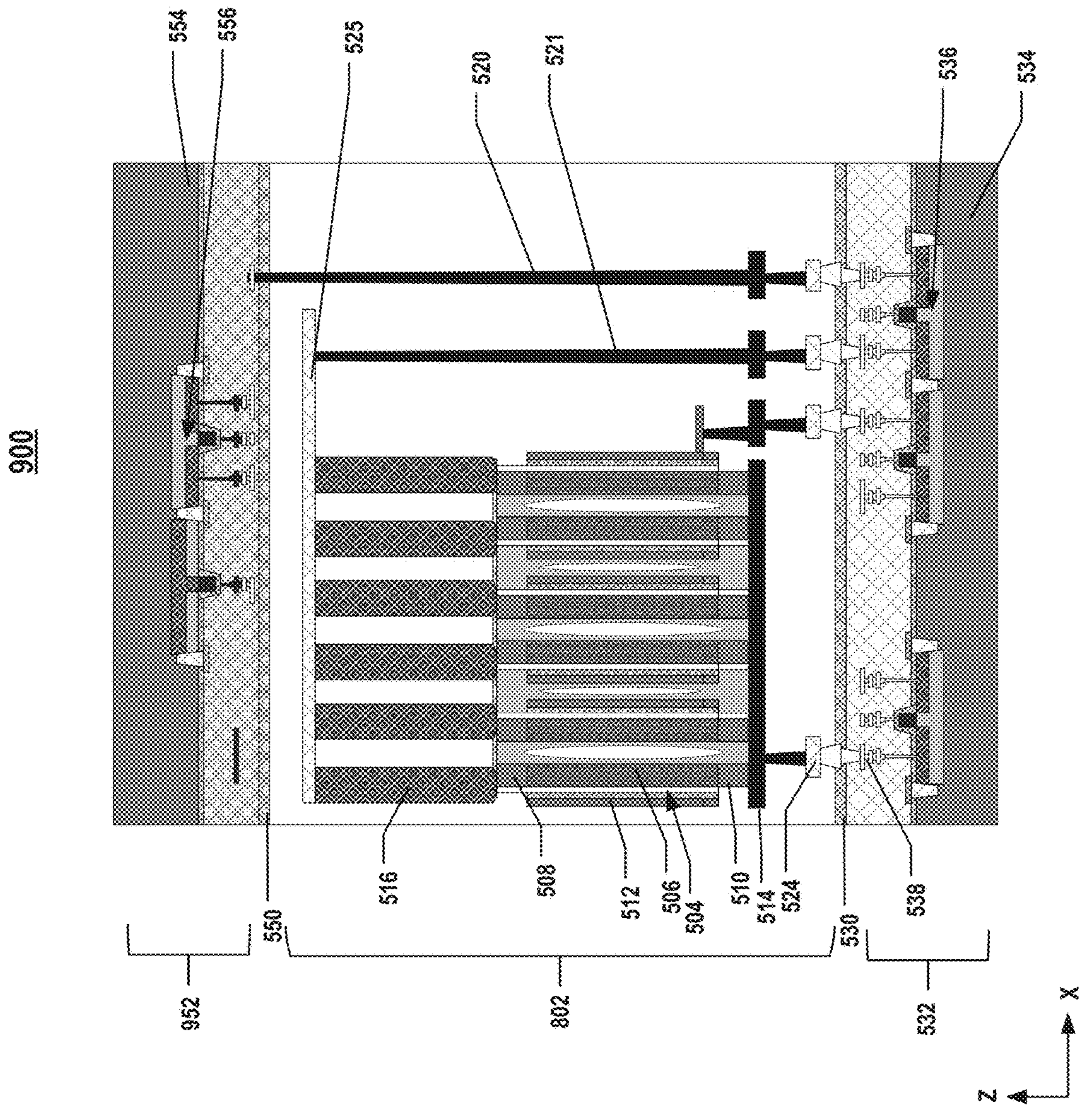

As shown in FIG. 27 and operation 2912 in FIG. 29, first peripheral circuit 532 is formed on substrate 534 and then is bonded with the memory array structure. First peripheral circuit 532 includes control and sensing circuits 536. In some implementations, first peripheral circuit 532 may include any suitable digital, analog, and/or mixed-signal circuits used for facilitating the operations of the memory cell 802. In some implementations, first peripheral circuit 532 may include one or more of a sense amplifier, a driver (e.g., a word line driver), any portions (e.g., a sub-circuit) of the functional circuits mentioned above, or any active or passive components of the circuit (e.g., transistors, diodes, resistors, or capacitors).

In some implementations, first peripheral circuit 532 may be bonded with memory cell 802 vertically through bonding (e.g., hybrid bonding) according to some implementations. Hybrid bonding, also known as “metal/dielectric hybrid bonding,” is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously.

It is understood that the forming process of first peripheral circuit 532 and memory cell 802 may be performed separately. In some implementations, the forming process of first peripheral circuit 532 and memory cell 802 may be performed simultaneously or sequentially and is not limited here.

Figure 28:
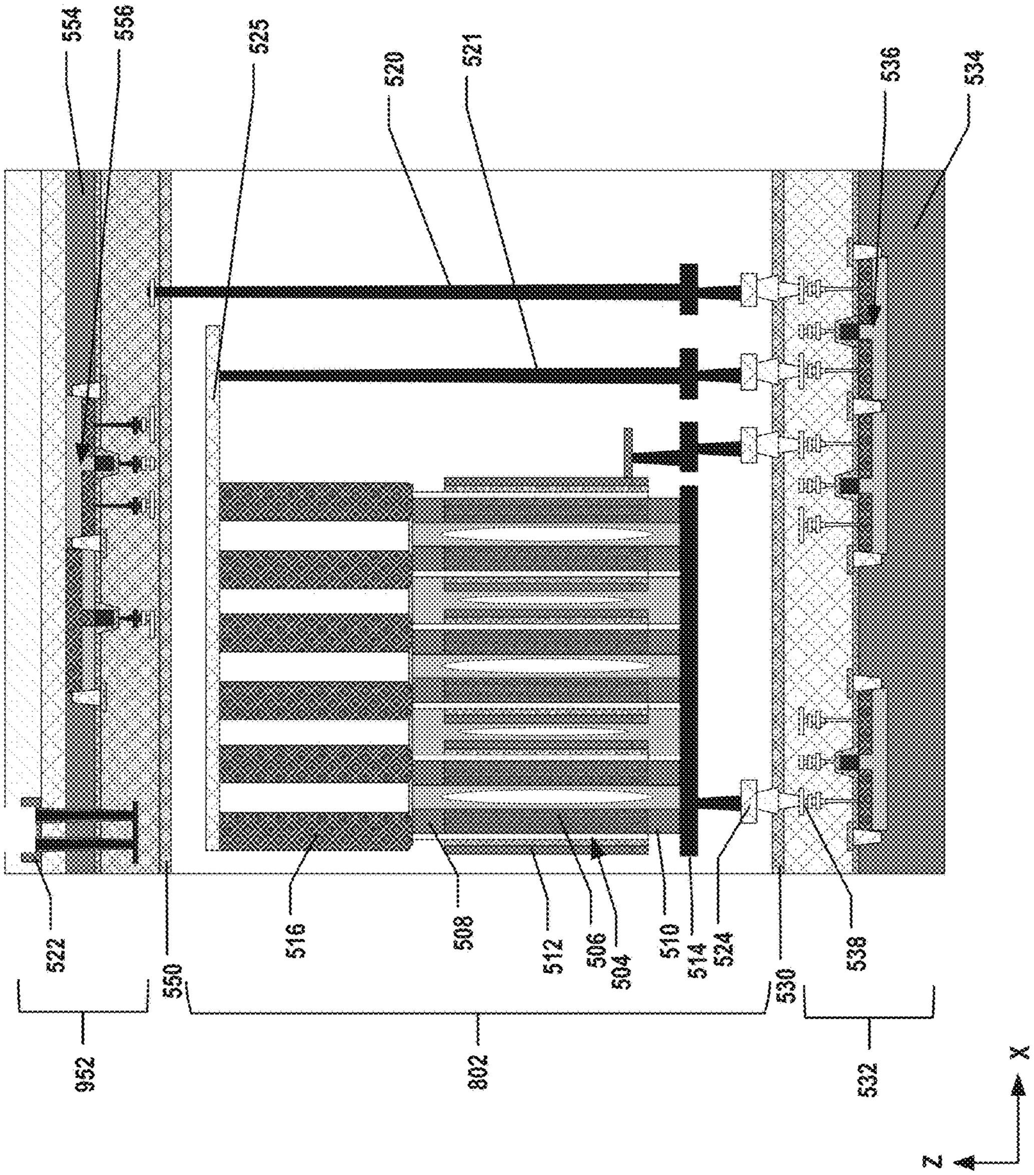
Figure 29:
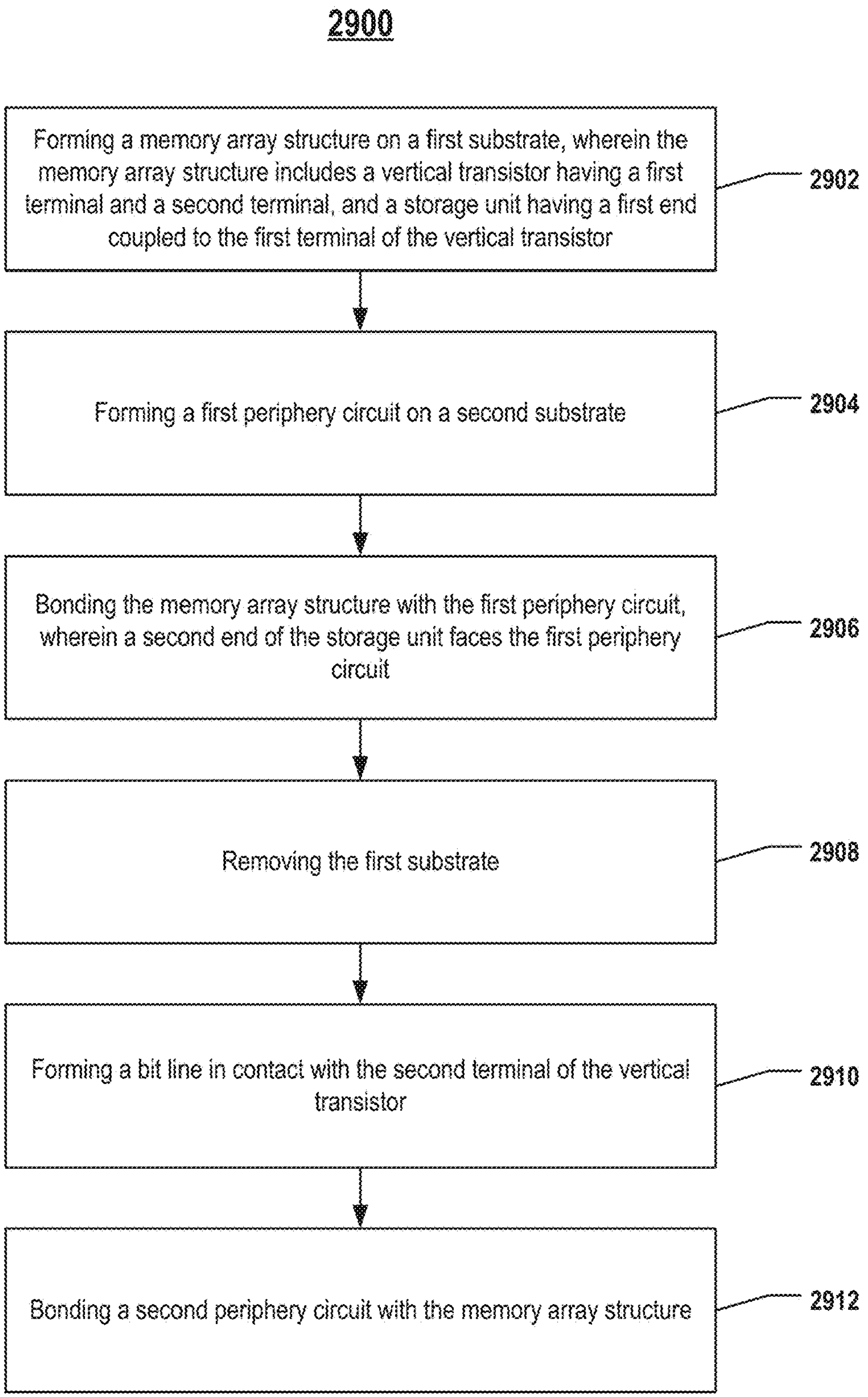
FIG. 29 illustrates a flowchart of a method for forming a memory device, according to some aspects of the present disclosure.

As shown in FIG. 28, pad structure 522 is then formed on peripheral circuit 952. In some implementations, one side of peripheral circuit 952 is in contact with memory cell 802, and pad structure 522 is formed on the other side of peripheral circuit 952. In some implementations, before forming pad structure 522, a thinning operation may be performed to thin substrate 554.

FIGS. 30-37 illustrate a fabrication process for forming memory device 800 including vertical transistor 504, according to some aspects of the present disclosure. FIG. 38 illustrates a flowchart of a method 3800 for forming memory device 800, according to some aspects of the present disclosure. For the purpose of better describing the present disclosure, the memory device 800 in FIGS. 30-37 and method 3800 in FIG. 38 will be discussed together. It is understood that the operations shown in method 3800 are not exhaustive and that other operations may be performed as well before, after, or between any of the illustrated operations. Further, some of the operations may be performed simultaneously, or in a different order than shown in FIGS. 30-37 and FIG. 38.

As shown in FIGS. 30-34 and operation 3802 in FIG. 38, a memory array structure is formed on a first side of substrate 554. The memory array structure, e.g., memory cell 802, includes vertical transistor 504 having first terminal 508 and second terminal 510, storage unit 516 having a first end coupled to first terminal 508 of vertical transistor 504, and bit line 514 coupled to second terminal 510 of vertical transistor 504.

Figure 30:
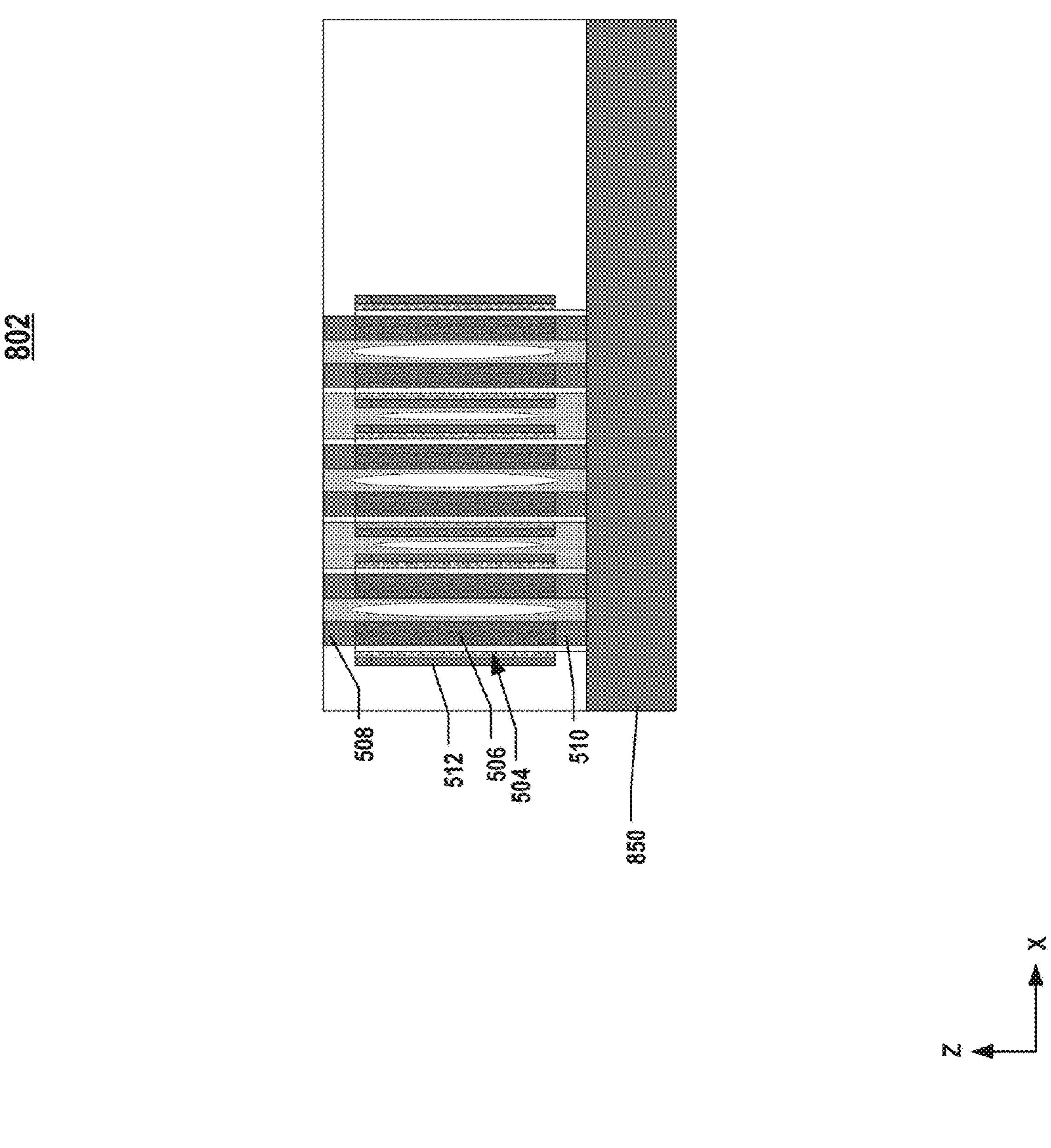
FIGS. 30-37 illustrate a fabrication process for forming a memory device including vertical transistors, according to some aspects of the present disclosure.

As shown in FIG. 30, substrate 850 is provided, and vertical transistor 504 is formed on substrate 850. In some implementations, vertical transistor 504 includes semiconductor body 506 extending in the Z-direction. First terminal 508 and second terminal 510 may be located on both sides of semiconductor body 506. In some implementations, first terminal 508 and second terminal 510 may be the source terminal and the drain terminal of vertical transistor 504 after performing the activation operations later.

In some implementations, after forming semiconductor body 506, gate structure 512 may be formed on at least one side of semiconductor body 506. In some implementations, gate structure 512 may be a multiple-layer structure, including the gate dielectric layer, the barrier layer, and the metal gate layer. In some implementations, a planarization operation may be performed to expose semiconductor body 506.

In some implementations, to form gate structure 512, a gate dielectric is formed over the exposed part of semiconductor body 506, a conductive layer is deposited over the gate dielectric, and the conductive layer is patterned to form a gate electrode over the gate dielectric. As a result, gate structure 512 may become word lines each extending in the word line direction (the Y-direction).

Figure 31:
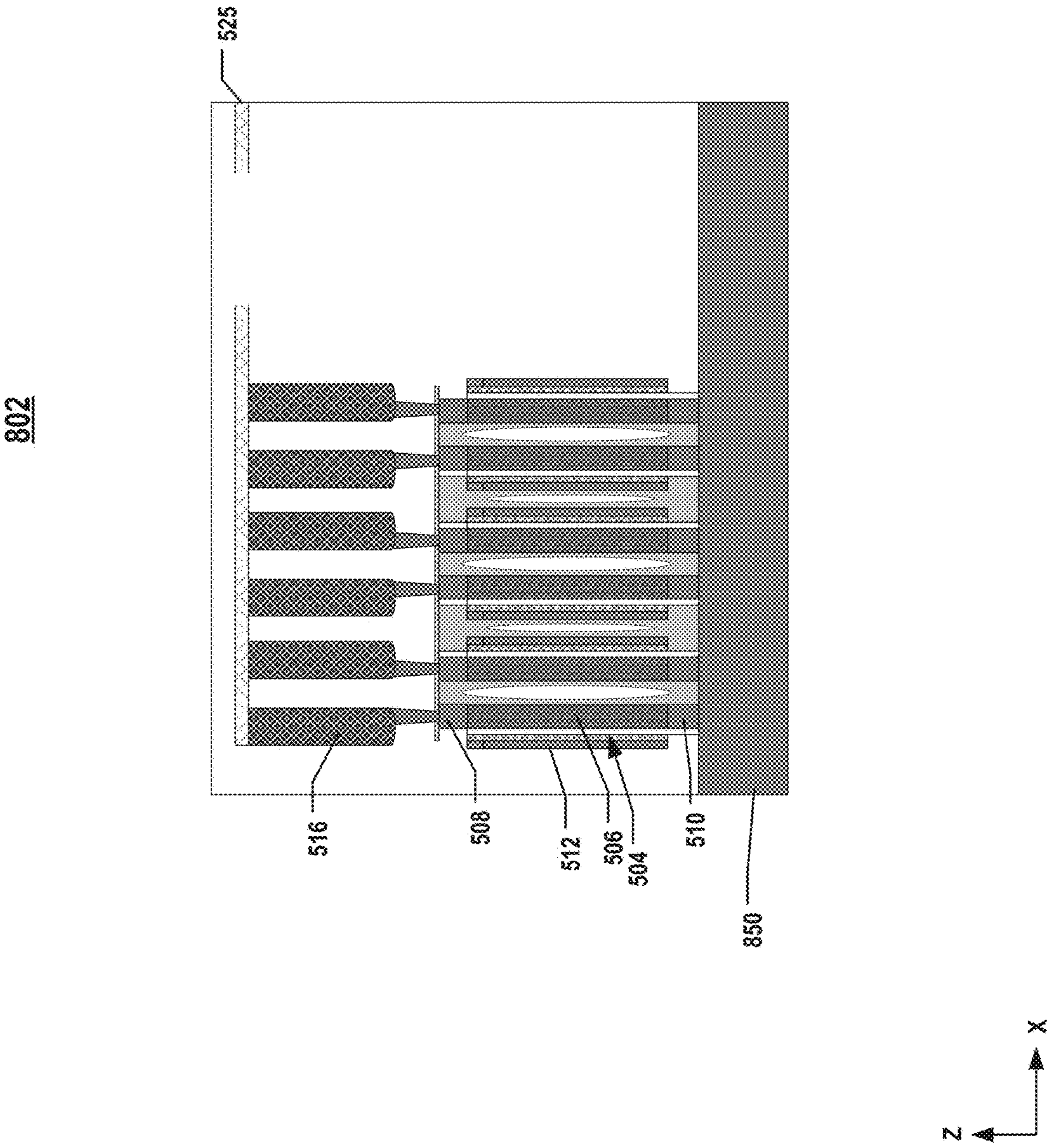

As shown in FIG. 31, storage unit 516 is formed on first terminal 508. In some implementations, before forming storage unit 516 on first terminal 508, first terminal 508 of semiconductor body 506 may be doped to form a source/drain terminal, e.g., a source terminal of vertical transistor 504. In some implementations, an implantation process and/or thermal diffusion process are performed to dope P-type dopants or N-type dopants to exposed upper ends of semiconductor bodies 506 to form the source/drain terminal. In some implementations, a silicide layer is formed on first terminal 508 by performing a silicidation process at the exposed end of semiconductor body 506. Then, storage unit 516 is formed on first terminal 508, and one end of a plurality of storage unit 516 is connected. As shown in FIG. 23, redistribution layer 525 is formed on storage unit 516. In some implementations, storage unit 516 is located between vertical transistor 504 and redistribution layer 525 along the Z-direction.

Figure 32:
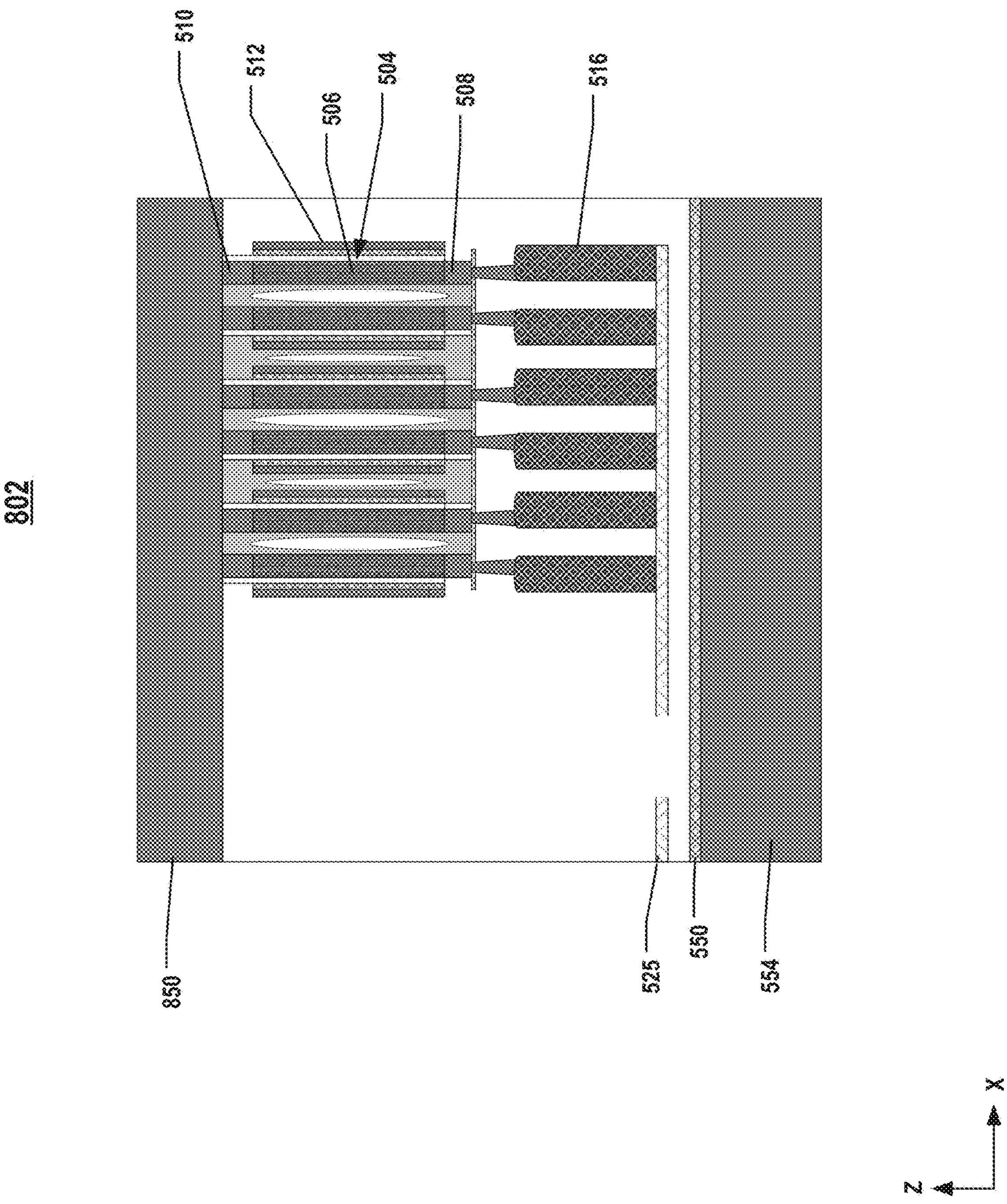
Figure 33:
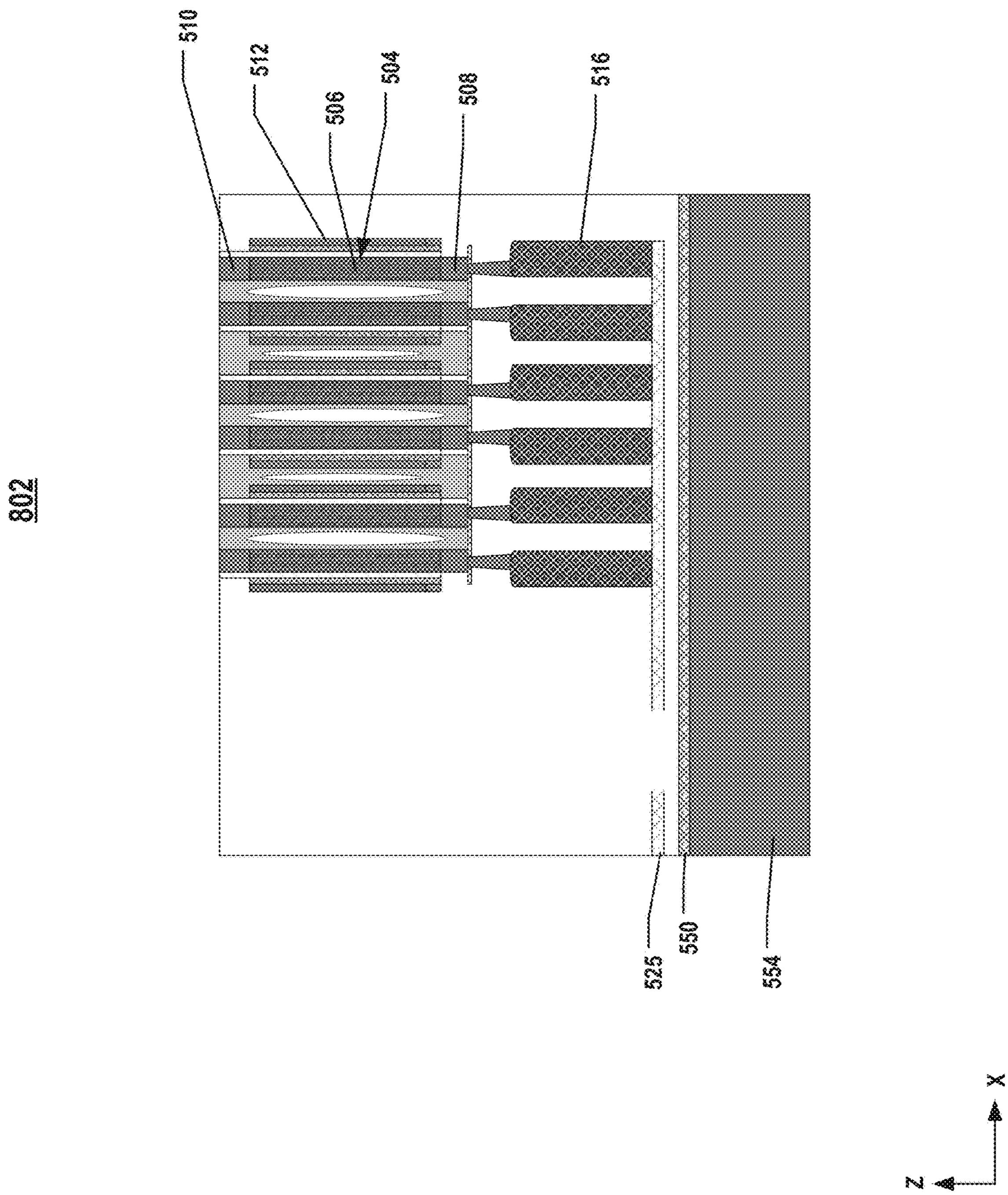

As shown in FIG. 32, substrate 554 is bonded to memory cell 802 having bonding interface 550. In some implementations, substrate 554 may be used as a carrier wafer in the following operations, and may also be used as a semiconductor substrate for forming the CMOS wafer in the later operations. As shown in FIG. 33, substrate 850 is then removed. In some implementations, substrate 850 may be removed by using wet etching, dry etch, or CMP operations. Then, in some implementations, an implantation process and/or thermal diffusion process are performed to dope P-type dopants or N-type dopants to the exposed second terminal 510 to form the source/drain terminal. In some implementations, a silicide layer is formed on second terminal 510 by performing a silicidation process at the exposed end of semiconductor body 506.

Figure 34:
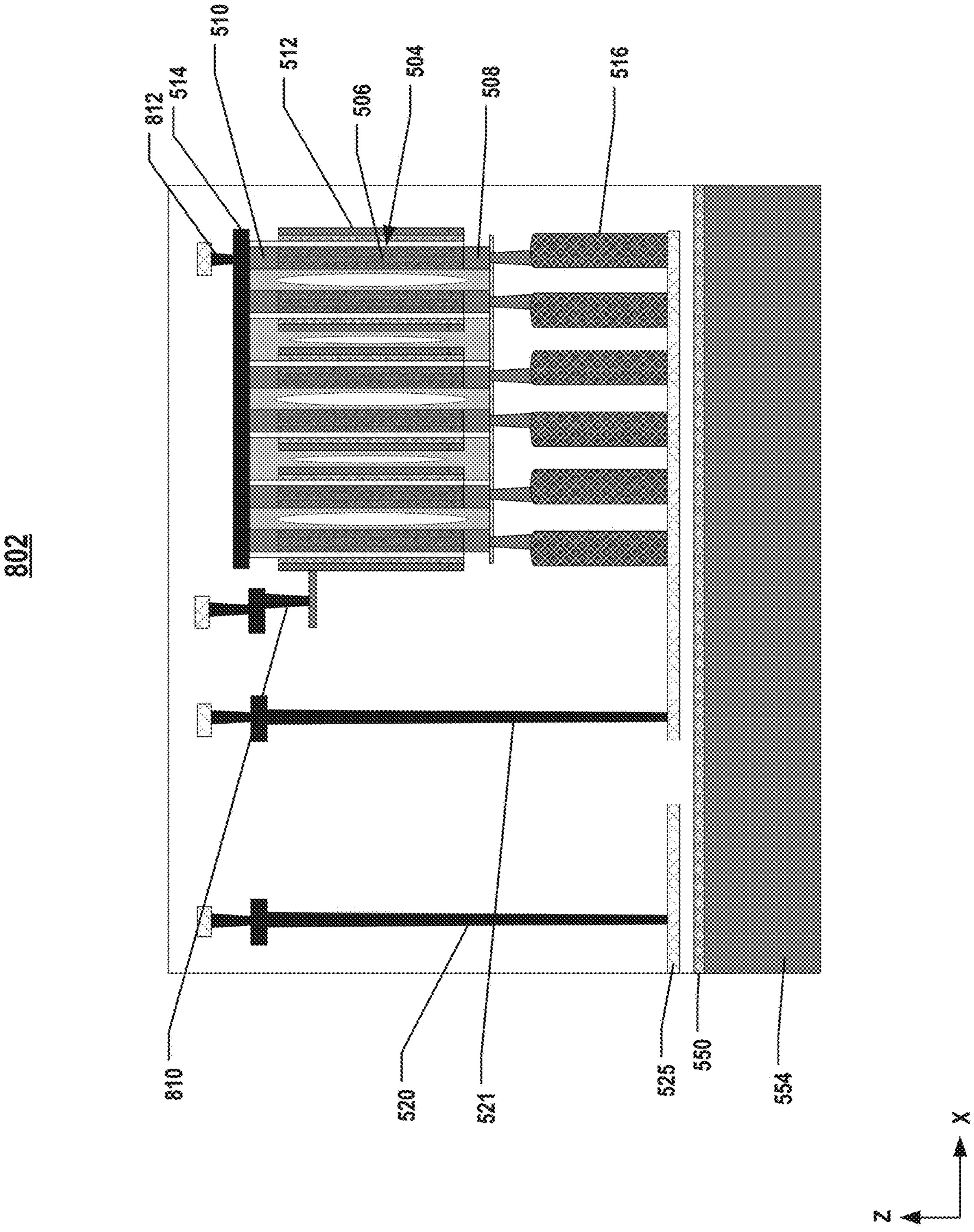

As shown in FIG. 34, bit line 514 is formed in contact with second terminal 510 of vertical transistor 504. In some implementations, contact structure 520 and contact structure 521 may be formed in memory cell 802 extending along the Z-direction. In some implementations, contact structure 520 may extend in contact with redistribution layer 525. In some implementations, contact structure 521 may extend in contact with redistribution layer 525.

Then, as shown in FIG. 34 and operation 3804 in FIG. 38, contact structure 518, contact structure 519, a contact structure 810, and a contact structure 812 are formed in memory cell 502. In some implementations, contact structure 518 is formed in contact with bit line 514, and contact structure 519 may be formed in contact with gate structure 512. In some implementations, contact structure 810 may be formed in contact with gate structure 512. In some implementations, contact structure 812 may be formed in contact with bit line 514.

Figure 35:
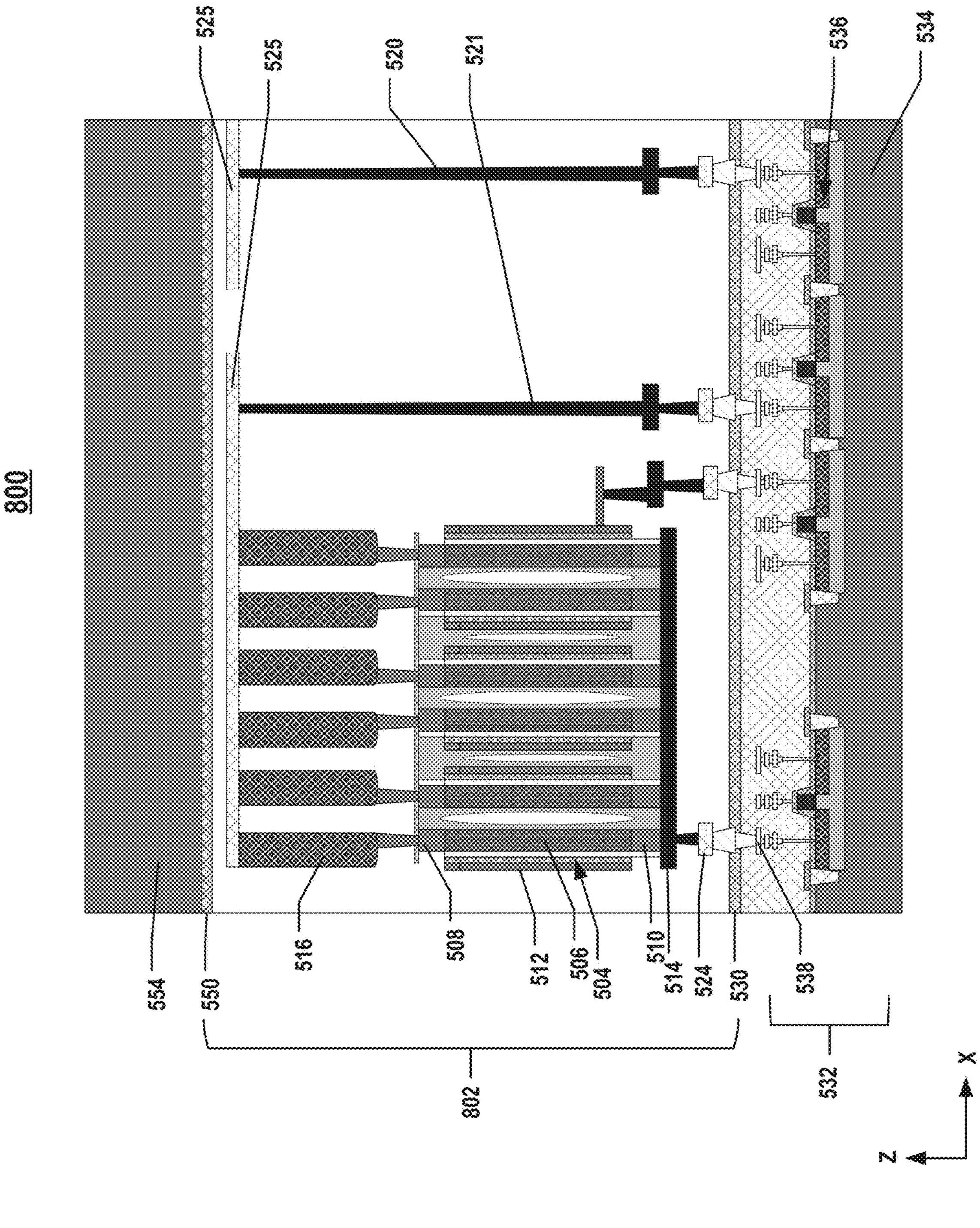

As shown in FIG. 35 and operation 3806 in FIG. 38, first peripheral circuit 532 is bonded with the memory array structure. First peripheral circuit 532 is formed on substrate 534 and then is bonded with the memory array structure. First peripheral circuit 532 includes control and sensing circuits 536. In some implementations, first peripheral circuit 532 may include any suitable digital, analog, and/or mixed-signal circuits used for facilitating the operations of the memory cell 802. In some implementations, first peripheral circuit 532 may include one or more of a sense amplifier, a driver (e.g., a word line driver), any portions (e.g., a sub-circuit) of the functional circuits mentioned above, or any active or passive components of the circuit (e.g., transistors, diodes, resistors, or capacitors).

In some implementations, first peripheral circuit 532 may be bonded with memory cell 802 vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously.

It is understood that the forming process of first peripheral circuit 532 and memory cell 802 may be performed separately. In some implementations, the forming process of first peripheral circuit 532 and memory cell 802 may be performed simultaneously or sequentially and is not limited here.

Figure 36:
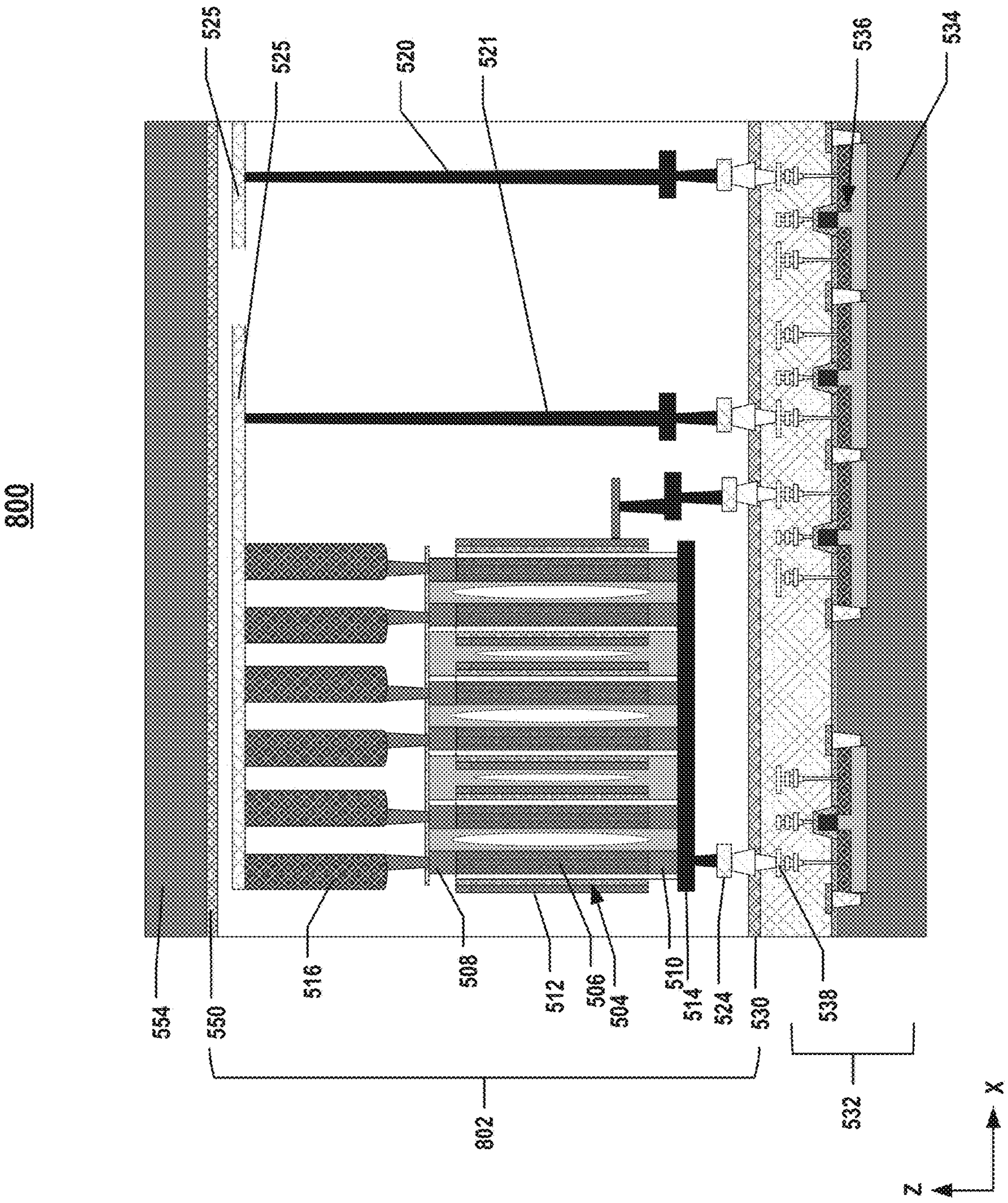

As shown in FIG. 36, substrate 554 may be thinned to a predefined thickness. In some implementations, because a through silicon via (TSV) structure may be formed extending through substrate 554 in a later operation, substrate 554 needs to be thinned before forming second peripheral circuit 552 in substrate 554. Substrate 554 includes a first side in contact with memory cell 802 through bonding interface 550, and a second side opposite to the first side.

Figure 37:
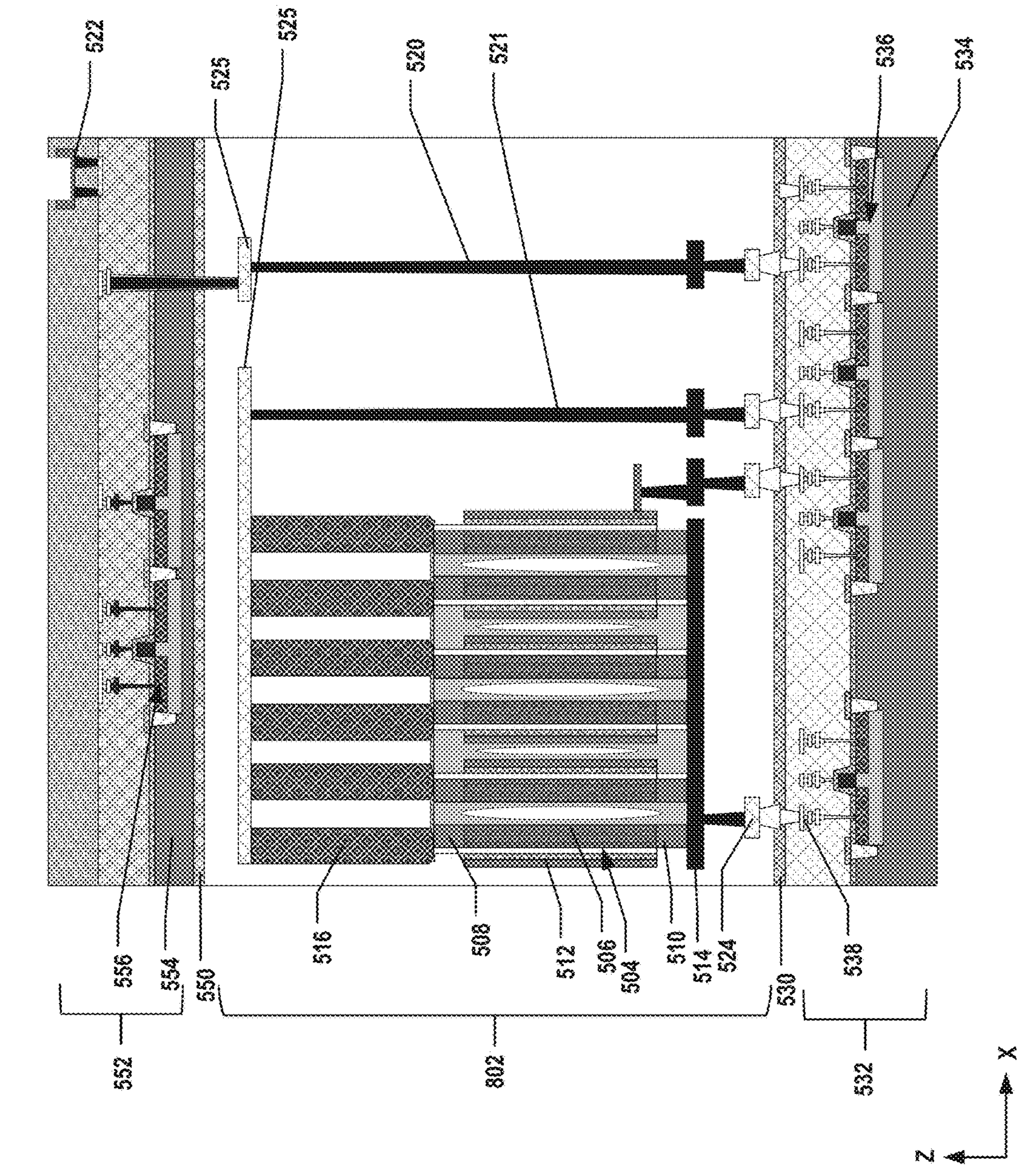
Figure 38:
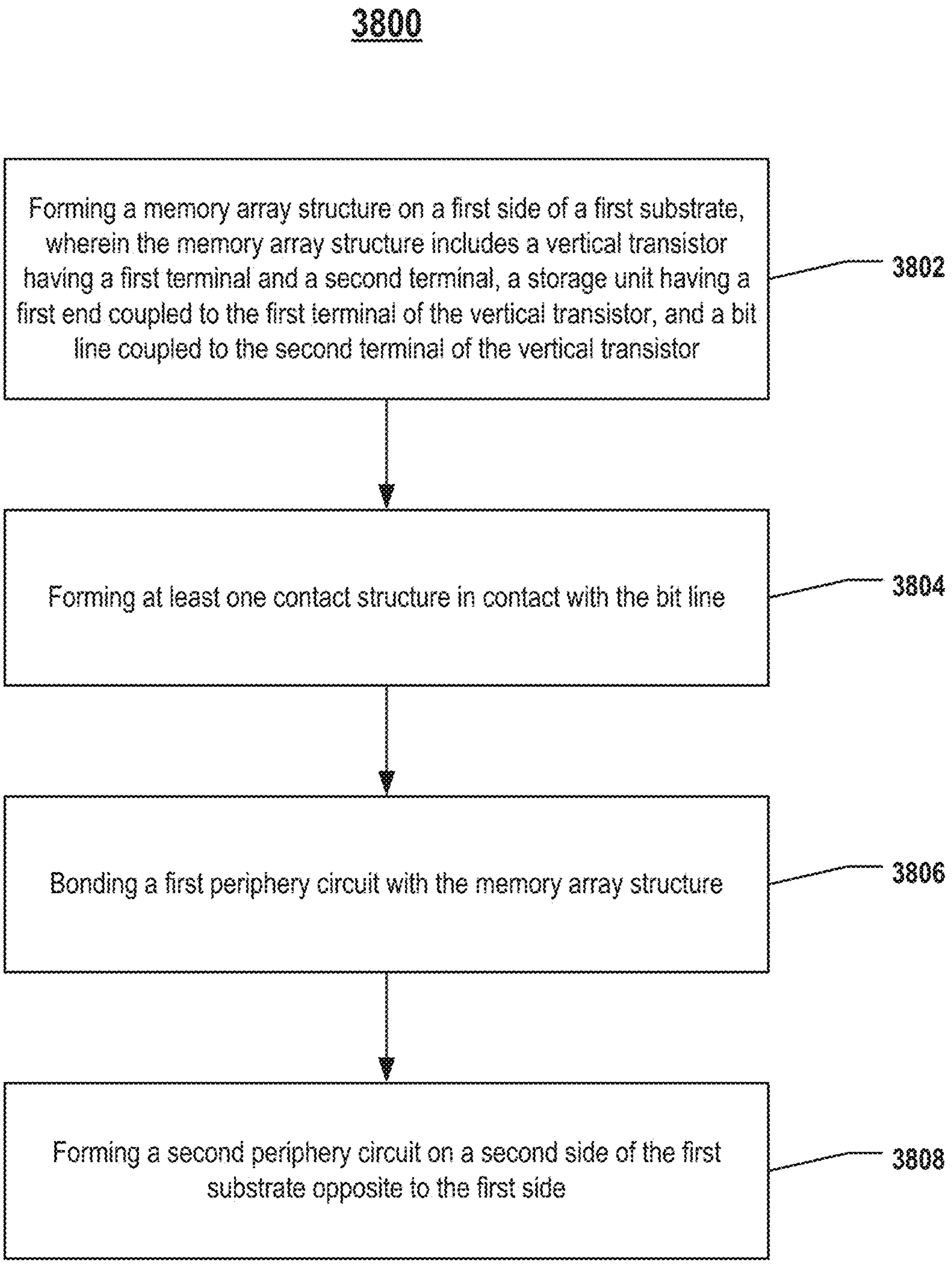
FIG. 38 illustrates a flowchart of a method for forming a memory device, according to some aspects of the present disclosure.

As shown in FIG. 37 and operation 3808 in FIG. 38, second peripheral circuit 552 is then formed on the second side of substrate 554 opposite to the first side, and pad structure 522 is formed on second peripheral circuit 552.

Figure 39:
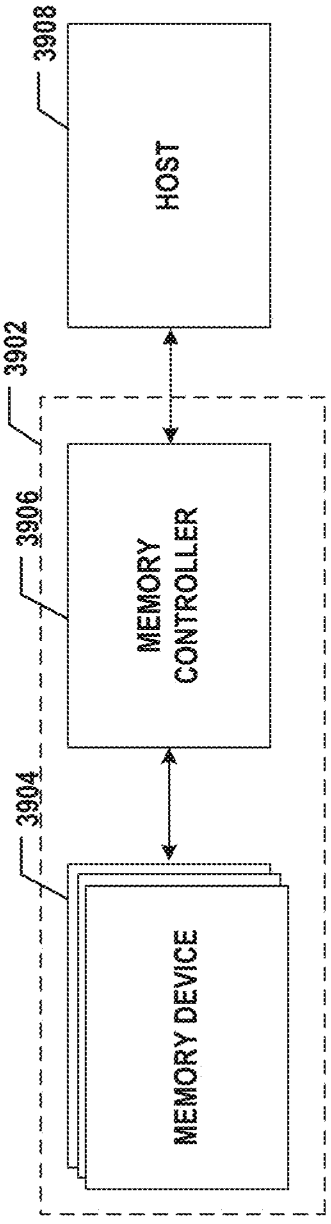
FIG. 39 illustrates a block diagram of an exemplary system having a memory device, according to some aspects of the present disclosure.

FIG. 39 illustrates a block diagram of a system 3900 having a memory device, according to some aspects of the present disclosure. System 3900 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 39, system 3900 can include a host 3908 and a memory system 3902 having one or more memory devices 3904 and a memory controller 3906. Host 3908 can be a processor of an electronic device, such as a central processing unit (CPU), or a system-on-chip (SoC), such as an application processor (AP). Host 3908 can be configured to send or receive the data to or from memory devices 3904.

Memory device 3904 can be any memory devices disclosed herein, such as memory devices 500, 800, 900, or 1000. In some implementations, memory device 3904 includes an array of memory cells each including a vertical transistor, as described above in detail.

Memory controller 3906 is coupled to memory device 3904 and host 3908 and is configured to control memory device 3904, according to some implementations. Memory controller 3906 can manage the data stored in memory device 3904 and communicate with host 3908. Memory controller 3906 can be configured to control operations of memory device 3904, such as read, write, and refresh operations. Memory controller 3906 can also be configured to manage various functions with respect to the data stored or to be stored in memory device 3904 including, but not limited to, refresh and timing control, command/request translation, buffer and schedule, and power management. In some implementations, memory controller 3906 is further configured to determine the maximum memory capacity that the computer system can use, the number of memory banks, memory type and speed, memory particle data depth and data width, and other important parameters. Any other suitable functions may be performed by memory controller 3906 as well. Memory controller 3906 can communicate with an external device (e.g., host 3908) according to a particular communication protocol. For example, memory controller 3906 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:

a memory array structure comprising:

a vertical transistor having a first terminal and a second terminal;

a storage unit having a first end coupled to the first terminal of the vertical transistor;

a bit line coupled to the second terminal of the vertical transistor; and a redistribution layer;

a first peripheral circuit coupled to a first surface of the memory array structure; and a second peripheral circuit coupled to a second surface of the memory array structure opposite to the first surface, wherein the vertical transistor comprises a semiconductor body extending in a first direction, and a gate structure coupled to at least one side of the semiconductor body; and wherein the bit line is in contact with the first peripheral circuit through a second contact structure, and the gate structure is in contact with the first peripheral circuit through a third contact structure via the redistribution layer.

2. The memory device of claim 1, further comprising:

a first contact structure extending through the memory array structure and in contact with the first peripheral circuit and the second peripheral circuit.

3. The memory device of claim 2, further comprising:

a first bonding interface disposed between the memory array structure and the first peripheral circuit; and a second bonding interface disposed between the memory array structure and the second peripheral circuit.

4. The memory device of claim 3, wherein the second peripheral circuit comprises a first surface in contact with the memory array structure through the second bonding interface, and a second surface comprising a pad structure.

5. The memory device of claim 4, wherein the first bonding interface is disposed between the first peripheral circuit and the storage unit, and the bit line is disposed between the second bonding interface and the vertical transistor.

6. The memory device of claim 4, wherein the first bonding interface is disposed between the first peripheral circuit and the bit line, and the second bonding interface is disposed between the second peripheral circuit and the storage unit.

7. The memory device of claim 6, wherein a second end of the storage unit is in contact with the first peripheral circuit through a fourth contact structure, and the fourth contact structure extends in the first direction longer than the vertical transistor.

8. The memory device of claim 1, wherein the second contact structure extends in the first direction longer than the vertical transistor, and the third contact structure extends in the first direction longer than the storage unit.

9. The memory device of claim 2, wherein the first contact structure is longer than the second contact structure in the first direction, and the second contact structure is longer than the third contact structure in the first direction.

10. A memory device, comprising:

a memory array structure comprising:

a vertical transistor having a first terminal and a second terminal;

a redistribution layer;

a storage unit having a first end coupled to the first terminal of the vertical transistor and a second end coupled to the redistribution layer; and a bit line coupled to the second terminal of the vertical transistor;

a first peripheral circuit coupled to a first surface of the memory array structure; and a second peripheral circuit coupled to a second surface of the memory array structure opposite to the first surface, wherein the vertical transistor comprises a semiconductor body extending in a first direction, and a gate structure coupled to at least one side of the semiconductor body; and wherein a second end of the storage unit is in contact with the first peripheral circuit through the redistribution layer and a first contact structure coupled to the redistribution layer, and the first contact structure extends in the first direction longer than the vertical transistor.

11. The memory device of claim 10, further comprising:

a second contact structure extending through the memory array structure and in contact with the first peripheral circuit and the second peripheral circuit.

12. The memory device of claim 11, further comprising:

a first bonding interface disposed between the memory array structure and the first peripheral circuit; and a second bonding interface disposed between the memory array structure and the second peripheral circuit.

13. The memory device of claim 12, wherein the second peripheral circuit comprises a first surface in contact with the memory array structure through the second bonding interface, and a second surface comprising a pad structure.

14. The memory device of claim 13, wherein the first bonding interface is disposed between the first peripheral circuit and the storage unit, and the bit line is disposed between the second bonding interface and the vertical transistor.

15. The memory device of claim 13, wherein the bit line is in contact with the first peripheral circuit through the first contact structure, and the gate structure is in contact with the first peripheral circuit through a third contact structure.

16. The memory device of claim 15, wherein the third contact structure extends in the first direction longer than the storage unit.

17. The memory device of claim 15, wherein the second contact structure is longer than the first contact structure in the first direction, and the first contact structure is longer than the third contact structure in the first direction.

18. The memory device of claim 12, wherein the first bonding interface is disposed between the first peripheral circuit and the bit line, and the second bonding interface is disposed between the second peripheral circuit and the storage unit.

19. A memory device, comprising:

a memory array structure comprising:

a vertical transistor having a first terminal and a second terminal;

a storage unit having a first end coupled to the first terminal of the vertical transistor; and a bit line coupled to the second terminal of the vertical transistor;

a first peripheral circuit coupled to a first surface of the memory array structure;

a second peripheral circuit coupled to a second surface of the memory array structure opposite to the first surface; and a first contact structure extending through the memory array structure and in contact with the first peripheral circuit and the second peripheral circuit;

wherein the vertical transistor comprises a semiconductor body extending in a first direction, and a gate structure coupled to at least one side of the semiconductor body; and wherein the bit line is in contact with the first peripheral circuit through a second contact structure, the gate structure is in contact with the first peripheral circuit through a third contact structure, the first contact structure is longer than the second contact structure in the first direction, and the second contact structure is longer than the third contact structure in the first direction.

20. The memory device of claim 19, further comprising:

a first bonding interface disposed between the memory array structure and the first peripheral circuit; and a second bonding interface disposed between the memory array structure and the second peripheral circuit.

* * * * *